United States Patent
Baek et al.

(10) Patent No.: US 10,172,241 B2
(45) Date of Patent: Jan. 1, 2019

(54) METHOD FOR PACKAGING FLEXIBLE DEVICE USING HOLDING WAFER, AND FLEXIBLE DEVICE MANUFACTURED BY THE SAME

(71) Applicant: KOREA ADVANCED INSTITUTE OF SCIENCE AND TECHNOLOGY, Daejeon (KR)

(72) Inventors: Kyung Wook Baek, Daejeon (KR); Keon Jae Lee, Daejeon (KR); Geon Tae Hwang, Daejeon (KR); Hyeon Kyun Yoo, Daejeon (KR); Do Hyun Kim, Daejeon (KR); Yoo Sun Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 174 days.

(21) Appl. No.: 14/478,279

(22) Filed: Sep. 5, 2014

(65) Prior Publication Data
US 2015/0077949 A1 Mar. 19, 2015

(30) Foreign Application Priority Data

Sep. 13, 2013 (KR) .................. 10-2013-0110231
Sep. 13, 2013 (KR) .................. 10-2013-0110232
Jul. 25, 2014 (KR) .................. 10-2014-0094466

(51) Int. Cl.
*H05K 3/32* (2006.01)
*H05K 1/03* (2006.01)
*H05K 3/00* (2006.01)
*H01L 23/00* (2006.01)

(52) U.S. Cl.
CPC .............. *H05K 3/323* (2013.01); *H01L 24/00* (2013.01); *H01L 2224/16225* (2013.01); *H01L 2224/32225* (2013.01); *H01L 2224/73204* (2013.01); *H01L 2224/73253* (2013.01); *H05K 1/0393* (2013.01); *H05K 3/0058* (2013.01);
(Continued)

(58) Field of Classification Search
CPC ........... Y10T 29/4913; Y10T 29/49128; Y10T 29/49126; Y10T 29/49124; Y10T 29/49117; Y10T 29/49002; H05K 1/0281; H05K 1/0393; H01L 2224/73204; H01L 2224/32225; H01L 2224/16225
USPC ....... 29/832, 830, 829, 825, 592.1; 257/632, 257/E29.002, E21.568
See application file for complete search history.

(56) References Cited

U.S. PATENT DOCUMENTS 7,446,384 B2 * 11/2008 Paik .................. H01L 27/14618
257/431
2005/0006650 A1 * 1/2005 Choi .................. H01J 11/12
257/77

(Continued)

*Primary Examiner* — Peter DungBa Vo
*Assistant Examiner* — Azm Parvez
(74) *Attorney, Agent, or Firm* — Rabin & Berdo, P.C.

(57) ABSTRACT

Provided is a flexible device, which includes a flexible substrate, a plurality of electrode lines provided on the flexible substrate and configured to contact the following anisotropic conductive film and then extend to a side of the flexible substrate, an anisotropic conductive film configured to contact the electrode line and laminated on the flexible substrate, a plurality of bumps provided on the anisotropic conductive film, and a circuit board having an electronic device provided at one side thereof and configured to contact the plurality of bumps.

7 Claims, 33 Drawing Sheets

(52) U.S. Cl.
CPC ............... *H05K 2203/016* (2013.01); *H05K 2203/0278* (2013.01); *H05K 2203/1105* (2013.01); *Y10T 29/4913* (2015.01)

(56) References Cited

U.S. PATENT DOCUMENTS

| | | | | |
|---|---|---|---|---|
| 2006/0254369 | A1* | 11/2006 | Yoon | A61B 5/6804 73/862.041 |
| 2010/0320086 | A1* | 12/2010 | Lee | G01N 33/5438 204/403.01 |
| 2013/0082361 | A1* | 4/2013 | Lee | H01L 23/3107 257/632 |

* cited by examiner

1. Transfer Curve

2. Threshold Voltage

3. Endurance

4. Retention

1. All Cells are Erased (11111111)

2. 01010101

3. 00000000

4. 10101010

5. 11111111

METHOD FOR PACKAGING FLEXIBLE DEVICE USING HOLDING WAFER, AND FLEXIBLE DEVICE MANUFACTURED BY THE SAME

CROSS-REFERENCE TO RELATED APPLICATIONS

This application claims priority under 35 U.S.C. § 119 to Korean Patent Application No. 10-2013-0110232, filed on Sep. 13, 2013, 10-2013-0110231 filed on Sep. 13, 2013, 10-2014-0094466 filed on Jul. 25, 2014 in the Korean Intellectual Property Office, the disclosure of which is incorporated herein by reference in its entirety.

TECHNICAL FIELD

The following disclosure relates to a method for packaging a flexible device and a flexible device manufactured by the same, and in particular, to a new method for packaging a flexible device having greater mechanical strength while keeping its flexibility and a flexible device manufactured by the same.

BACKGROUND

A flexible electronic device means an electronic device which may bend or crook due to a force applied thereto. This flexible device should have flexibility in itself, and a substrate below the device and a coating layer covering the device should also have flexibility to some extent.

However, a flexible substrate such as plastic may not easily endure a semiconductor manufacturing process which is generally performed in a high-temperature environment. Further, a produced flexible device should have sufficient adhesive force among the substrate, the device and the coating layer, but if the adhesion is insufficient, the substrate, the device and the coating layer may be separated from each other due to bending. In addition, an excellent waterproof property of the coating layer in a fluidic environment, for example in a body, is very important for the flexible electronic device, but a flexible electronic device having a coating layer with a sufficient waterproof property has not yet proposed.

Therefore, there is needed a flexible device packaging technique for transmitting an electric signal generated from a device to the outside while ensuring a waterproof property of the device, protecting the device mechanically and effectively emitting heat even when a large scale integrated circuit (LSI) is formed with a flexible design.

SUMMARY

An embodiment of the present disclosure is directed to providing a new method for packaging a flexible device and a flexible device manufactured by the same.

In an aspect of the present disclosure, there is provided a flexible device, which includes: a flexible substrate; and an electronic device provided on a circuit board, wherein an anisotropic conductive film is provided between the electronic device and the flexible substrate. In other words, in the present disclosure, a flexible substrate and an electronic device are electrically and physically connected by means of the anisotropic conductive film laminated on the flexible substrate, and a flexible device including a circuit board (for example, a silicon substrate) with sufficient flexibility is provided. According to the present disclosure, the flexibility of the circuit board may be maintained by adjusting a thickness of the circuit board, and the circuit of the SOI substrate may minimize a mechanical stress caused from bending of a device by adjusting a thickness of a protection layer which is finally coated.

DETAILED DESCRIPTION OF EMBODIMENTS

Figure 1:
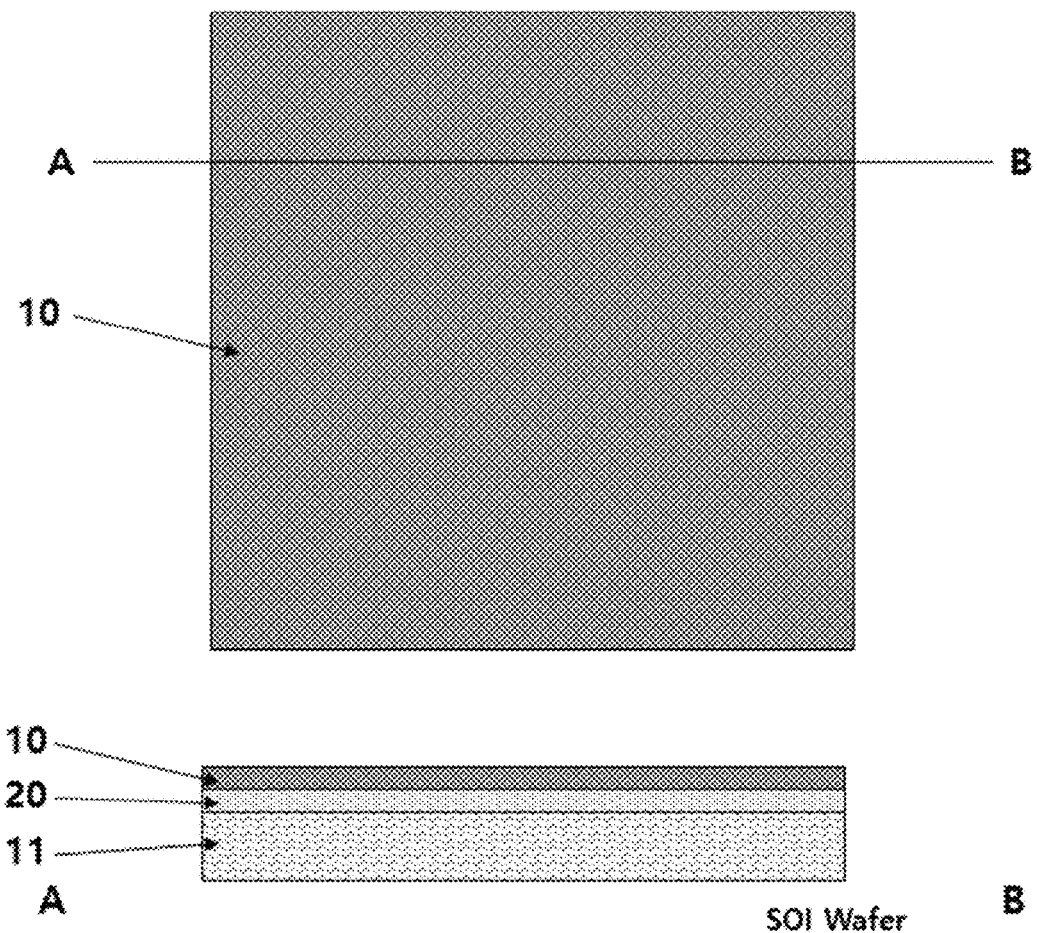
FIGS. 1 to 7 are diagrams for illustrating a method for packaging a flexible device according to an embodiment of the present disclosure.

Hereinafter, the present disclosure will be described in detail with reference to the drawings. The following embodiments are just examples for helping a person skilled in the art to fully understand the present disclosure. Therefore, the present disclosure is not limited to the following embodiments but may be implemented in other ways. In addition, in the drawings, a width, length, thickness or the like of a component may be exaggerated for convenience. In the specification, the like reference numeral designates the like element, and all accompanying drawings are interpreted as plane views and partially sectional views (taken along the line A-A', B-B', or C-C'). In addition, the term "flexible" used in the present disclosure is distinguished from a silicon substrate or the like which is rigid, and includes flexible or foldable properties with which a substrate such as a plastic substrate can be bent or folded by a predetermined angle.

In order to solve the existing problems described above, the present disclosure provides a flexible device, which includes a flexible substrate; and an electronic device provided on a circuit board, wherein an anisotropic conductive film is provided between the electronic device and the flexible substrate. In other words, in the present disclosure, a flexible substrate and an electronic device are electrically and physically connected by means of the anisotropic conductive film laminated on the flexible substrate, and for this, a flexible device including a circuit board (for example, a silicon substrate) with sufficient flexibility is provided. At this time, the anisotropic conductive film and the circuit board are connected by means of a conductive line and a bump which is a conductive member used for circuit packaging. In other words, in the present disclosure, the bump of the circuit board and the electrode line of the flexible substrate are connected by means of the anisotropic conductive film which is used for circuit packaging. Hereinafter, a method for manufacturing a flexible device by means of packaging according to the present disclosure will be described in detail with reference to the drawings.

FIGS. 1 to 7 are diagrams for illustrating a method for packaging a flexible device according to an embodiment of the present disclosure.

Referring to FIG. 1, a silicon-on-insulator (SOI) substrate composed of a silicon 11, a silicon oxide layer 20 and a silicon layer 10 is depicted. In an embodiment of the present disclosure, the silicon-based substrate may be used as a substrate serving as a circuit in the future and thus is hereinafter called a circuit board. In particular, the lower silicon layer has a reduced thickness due to an etching process performed later, and as a result, the circuit board obtains flexibility during the manufacturing process.

Figure 2:
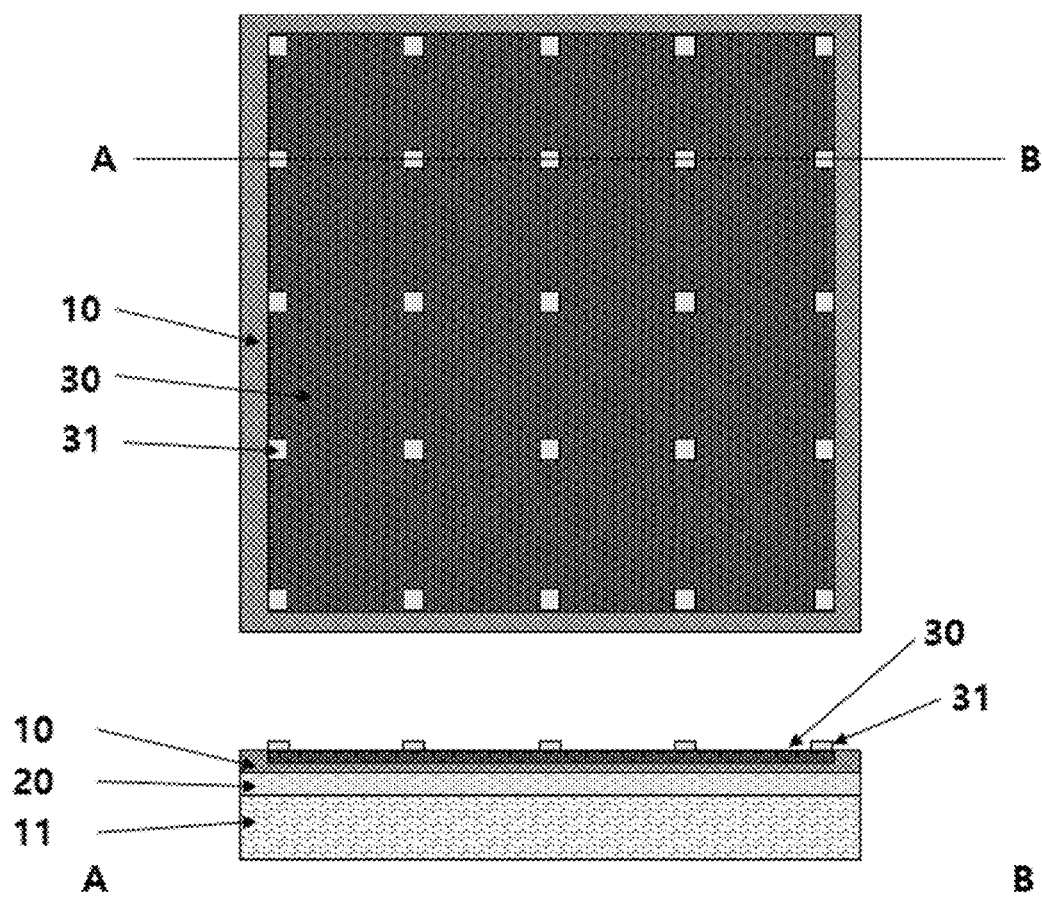

Referring to FIG. 2, an electronic device such as a large scale integrated circuit (LSI) is manufactured on the substrate. Since the electronic device 30 is manufactured according to a general substrate manufacturing method, this is not described in detail here. A conductive material, for example a bump 31 serving as a protruded member made of metal material such as gold, is laminated on the electronic device 30.

The bump 31 is electrically connected to the electronic device 30 and discharges an electric signal generated from the electronic device 30 to the outside, and further, the bump 31 serves as a placing or adhering member for accommodating a conductive substrate which is brought into contact thereto later.

Figure 3:
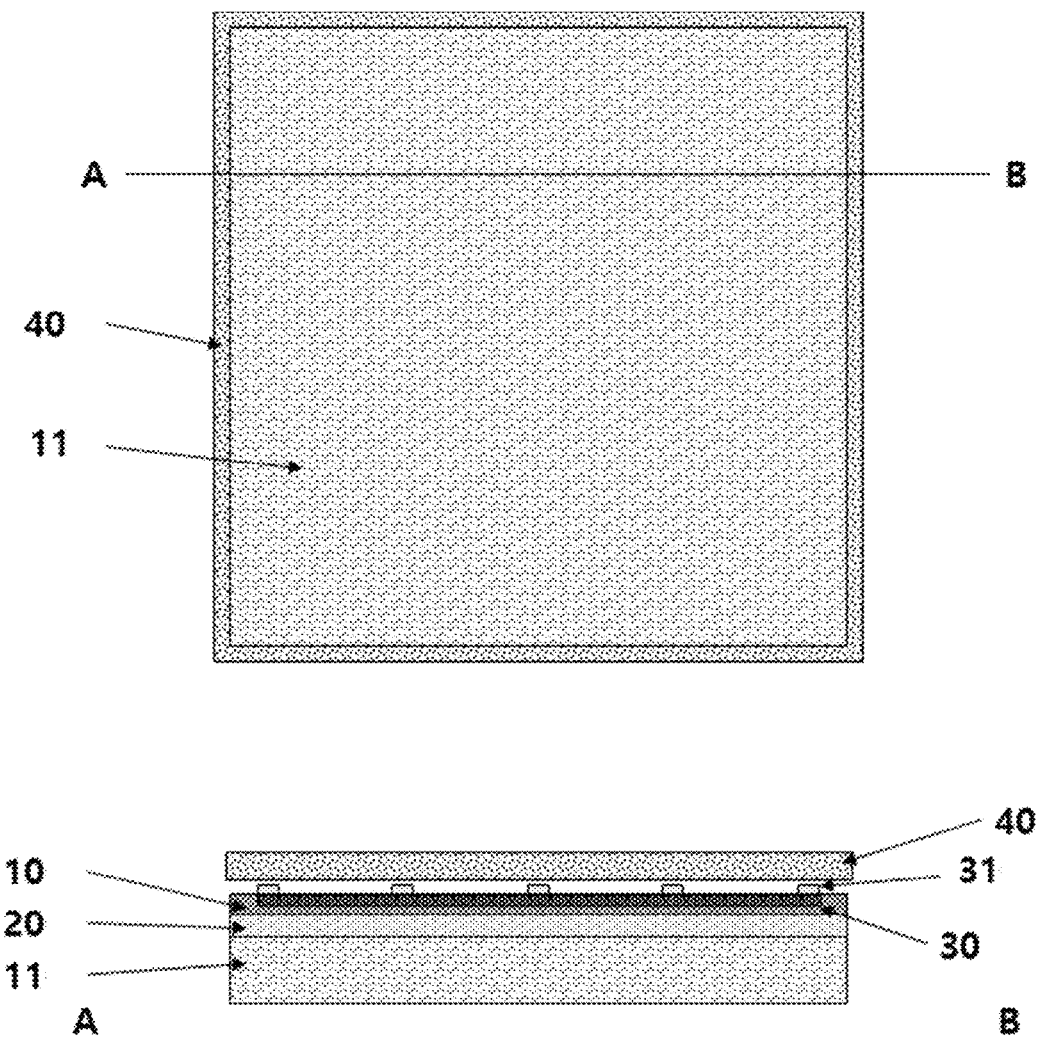

Referring to FIG. 3, an anisotropic conductive film 40 comes into contact with the bump 31 to face the bump 31.

Figure 4:
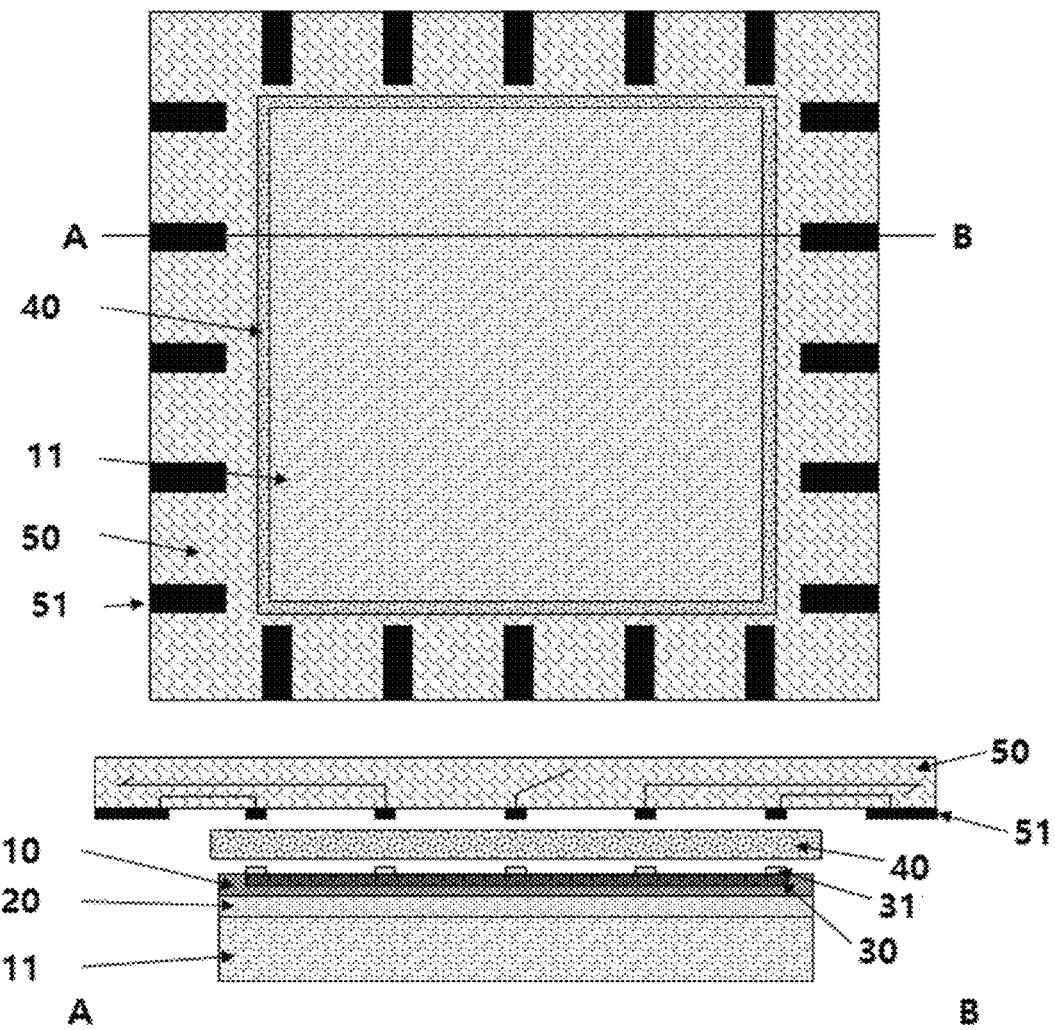
Figure 5:
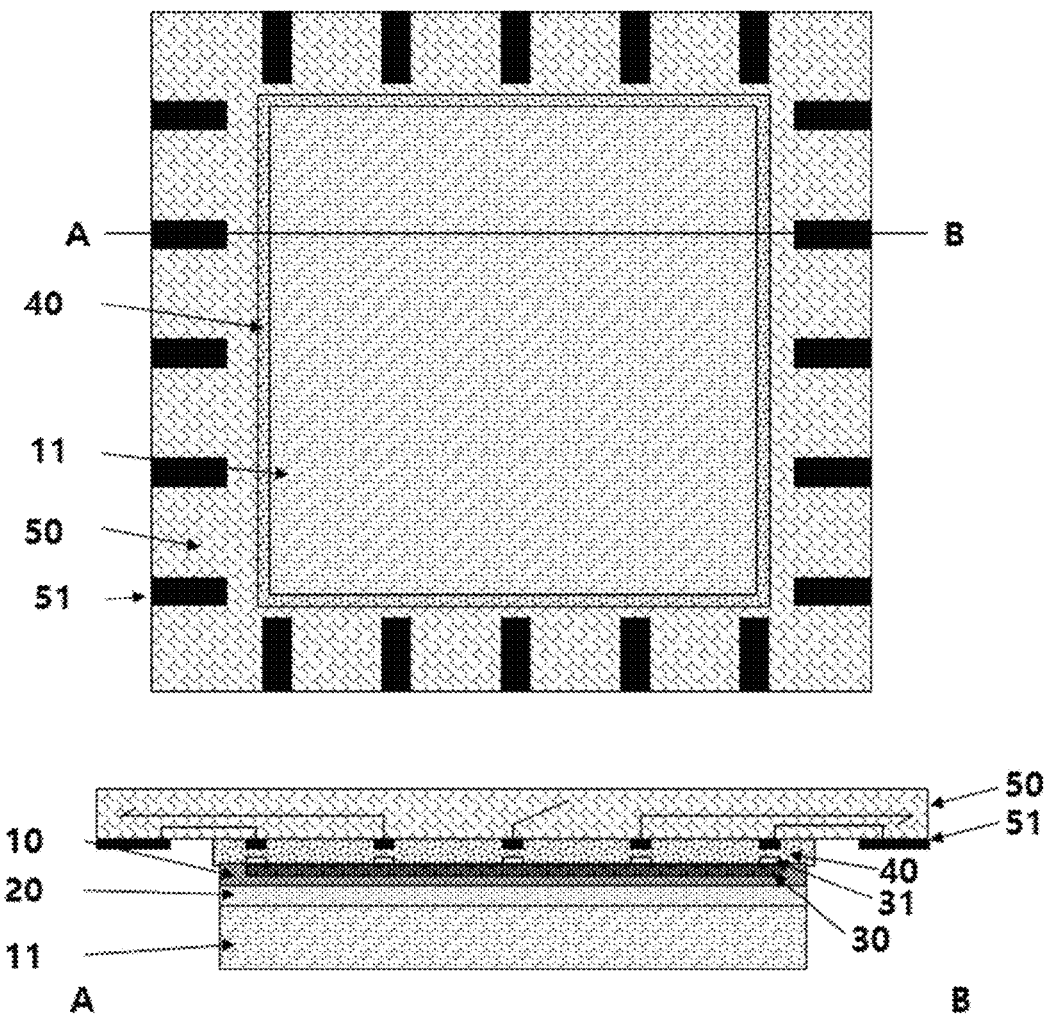

Referring to FIGS. 4 and 5, a flexible substrate 50 is laminated on the anisotropic conductive film 40 and then heated and pressed. Accordingly, the anisotropic conductive film has conductivity and adhesion in a vertical direction and is isolated in a horizontal direction. At this time, in order to solve a problem that an electric signal from the electronic device is intercepted by the flexible substrate 50 basically having an isolation property, the inventor of the present disclosure provides an electrode line 51 at the flexible substrate in advance to contact the anisotropic conductive film 40. By doing so, by means of the anisotropic conductive film 40 having conductivity in a vertical direction through the heating and pressing process, an electric signal generated from the device is connected to the electrode line 51 of the flexible substrate. In an embodiment of the present disclosure, the flexible substrate has a greater area than the circuit board, and the electrode line contacts the anisotropic conductive film 40 and then extends to a side of the flexible substrate which is exposed to the outside. By doing so, the device may be electrically connected more easily after the device packaging process.

Figure 6:
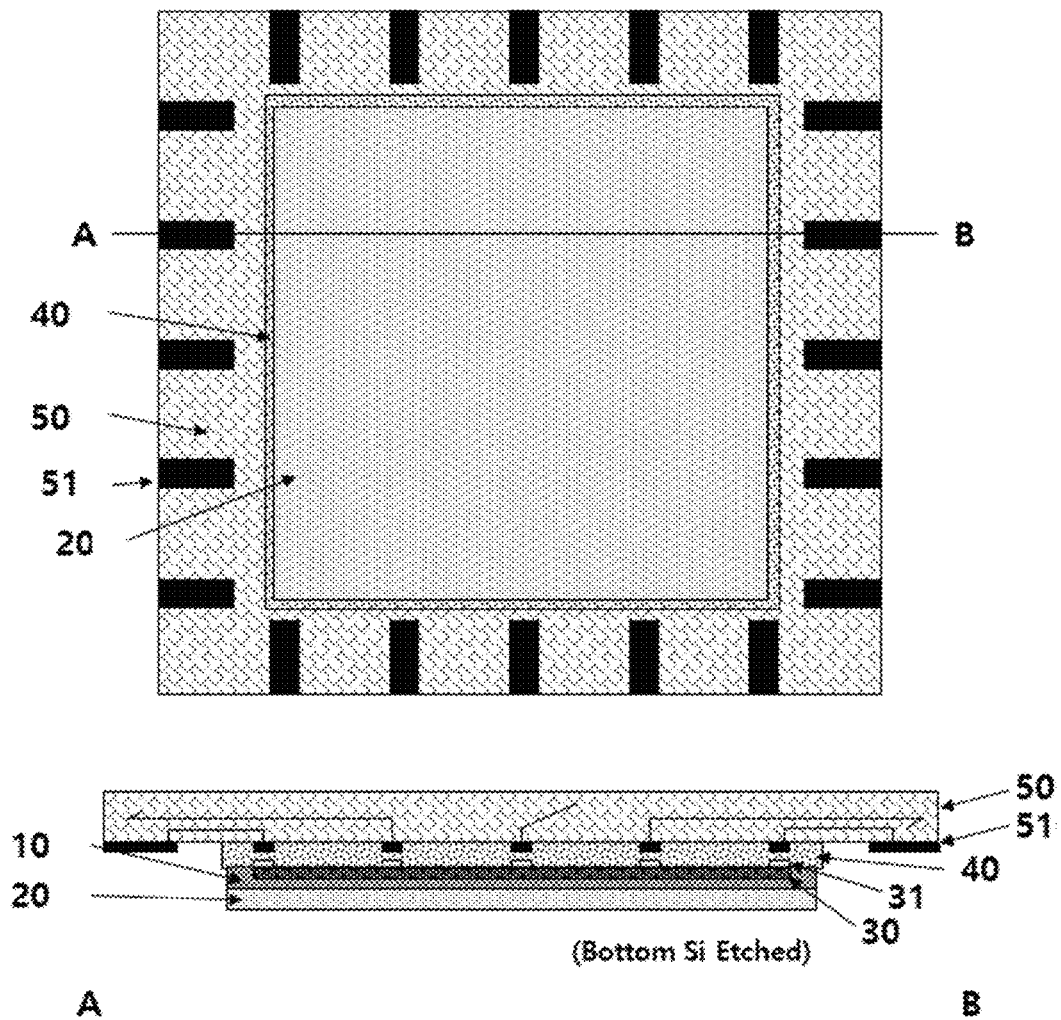

Referring to FIG. 6, a thickness of the circuit board is adjusted. In an embodiment of the present disclosure, the lower silicon layer 11 is removed by means of an etching process or the like due to a structural characteristic of the SOI substrate. In an embodiment of the present disclosure, the thickness of the SOI substrate is adjusted after the heating and pressing process. However, the present disclosure is not limited thereto, and the thickness of the SOI substrate may also be adjusted after the anisotropic conductive film is laminated. In this way, distortion of the device caused by the reduced thickness of the circuit board may be solved. Further, in order to reduce the time required for the etching process, the silicon oxide layer at the rear surface may be physically ground to an expected thickness (for example, 50 micrometers) in advance before adhesion.

Figure 7:
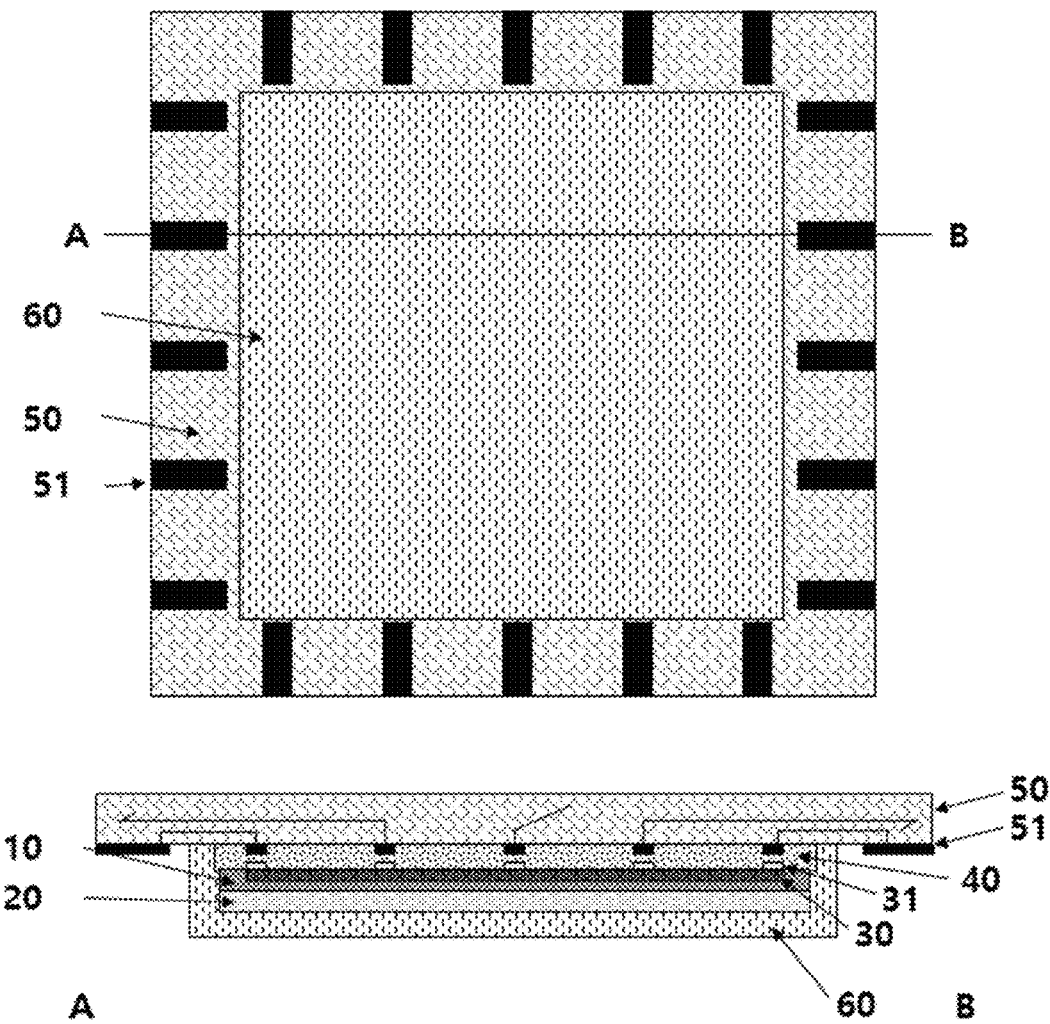

Referring to FIG. 7, a passivation layer 60 serving as a protection layer is coated on a front surface and a side surface of the electronic device 30 laminated on the flexible substrate 50. By doing so, a final flexible substrate is completed, and a packaged device capable of enduring external thermal or mechanical impacts is finally completed.

The above method is directed to a method for manufacturing a flexible device, particularly a packaged flexible device, according to an embodiment of the present disclosure, and the present disclosure is not limited thereto. In other words, the flexible device according to an embodiment of the present disclosure includes: a flexible substrate; a plurality of electrode lines provided on the flexible substrate and configured to contact the following anisotropic conductive film and then extend to a side of the flexible substrate; an anisotropic conductive film configured to contact the electrode line and laminated on the flexible substrate; a plurality of bumps provided on the anisotropic conductive film; and a circuit board having an electronic device provided at one side thereof and configured to contact the plurality of bumps, wherein the circuit board has a thickness which ensures flexibility.

In an embodiment of the present disclosure, the circuit board is a SOI substrate, and its thickness is adjusted by removing the silicon layer at its rear surface after the electronic device is manufactured in advance. Further, in the flexible device coated with a protection layer for protecting the electronic device, an electric device such as a highly integrated circuit provided at the silicon substrate is provided at a mechanically neutral location of a device coated with the protection layer, and thus a stable structural characteristic is ensured against a mechanical force applied from the outside.

FIGS. 8 to 24 are diagrams for illustrating a method for manufacturing a flexible device according to another embodiment of the present disclosure.

Figure 8:
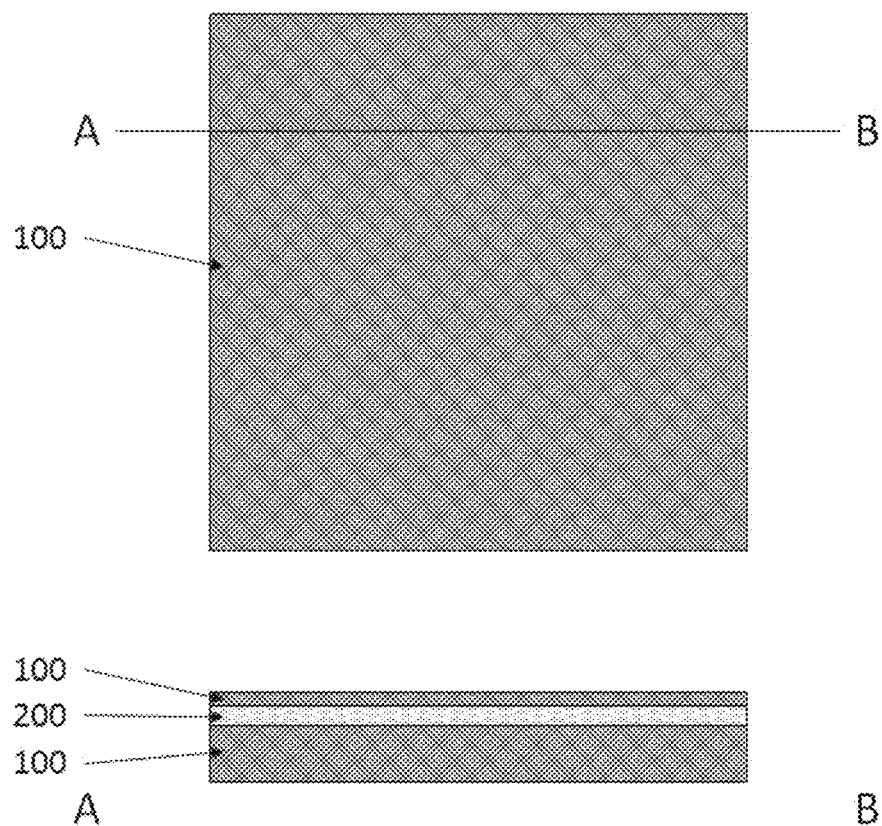
FIGS. 8 to 24 are diagrams for illustrating a method for manufacturing a flexible device according to another embodiment of the present disclosure.

Referring to FIG. 8, a SOI substrate including a silicon layer 100, a silicon oxide layer 200 and a silicon layer 100 is depicted. In an embodiment of the present disclosure, the silicon-based substrate may serve as a substrate which is to be used as a circuit and thus is hereinafter called a circuit board. Particularly, the lower silicon layer has a reduced thickness by means of an etching process performed later, and thus the circuit board obtains flexibility during the manufacturing process.

Figure 9:
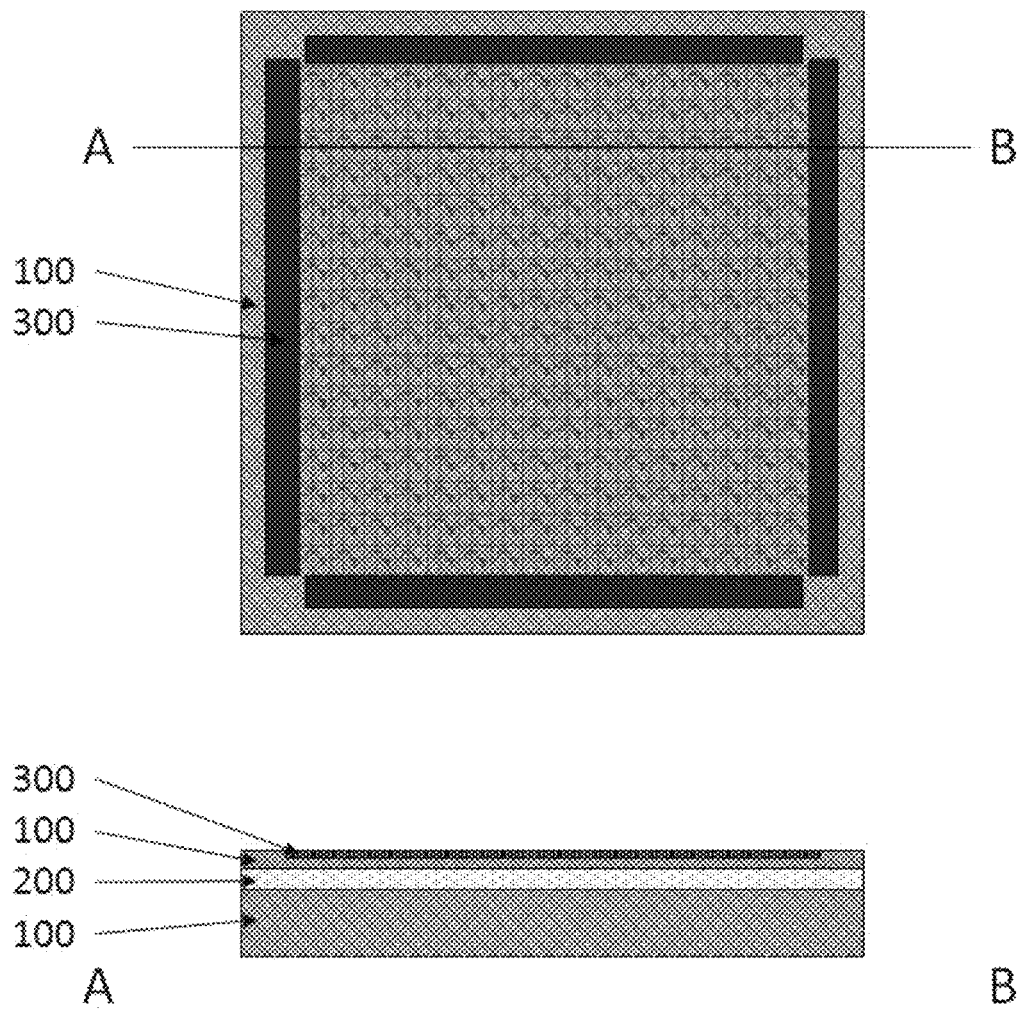

Referring to FIG. 9, an electronic device 300 such as a large scale integrated circuit (LSI) is manufactured on the substrate. Since the electronic device 300 is manufactured according to a general substrate manufacturing method, this is not described in detail here.

Figure 10:
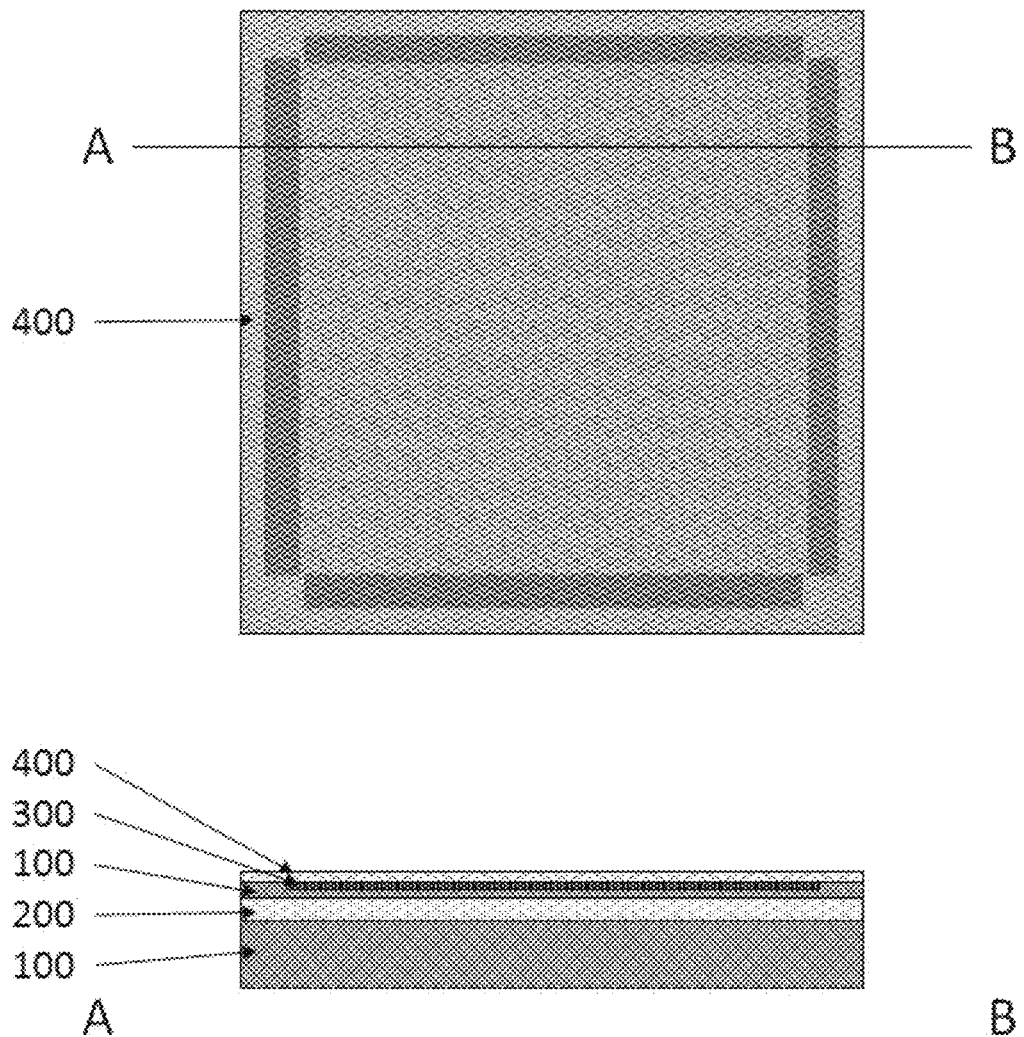

Referring to FIG. 10, the electronic device 300 is coated with a first adhesive resin 400. In an embodiment of the present disclosure, the first adhesive resin 400 is an adhesive epoxy, but the present disclosure is not limited thereto.

Figure 11:
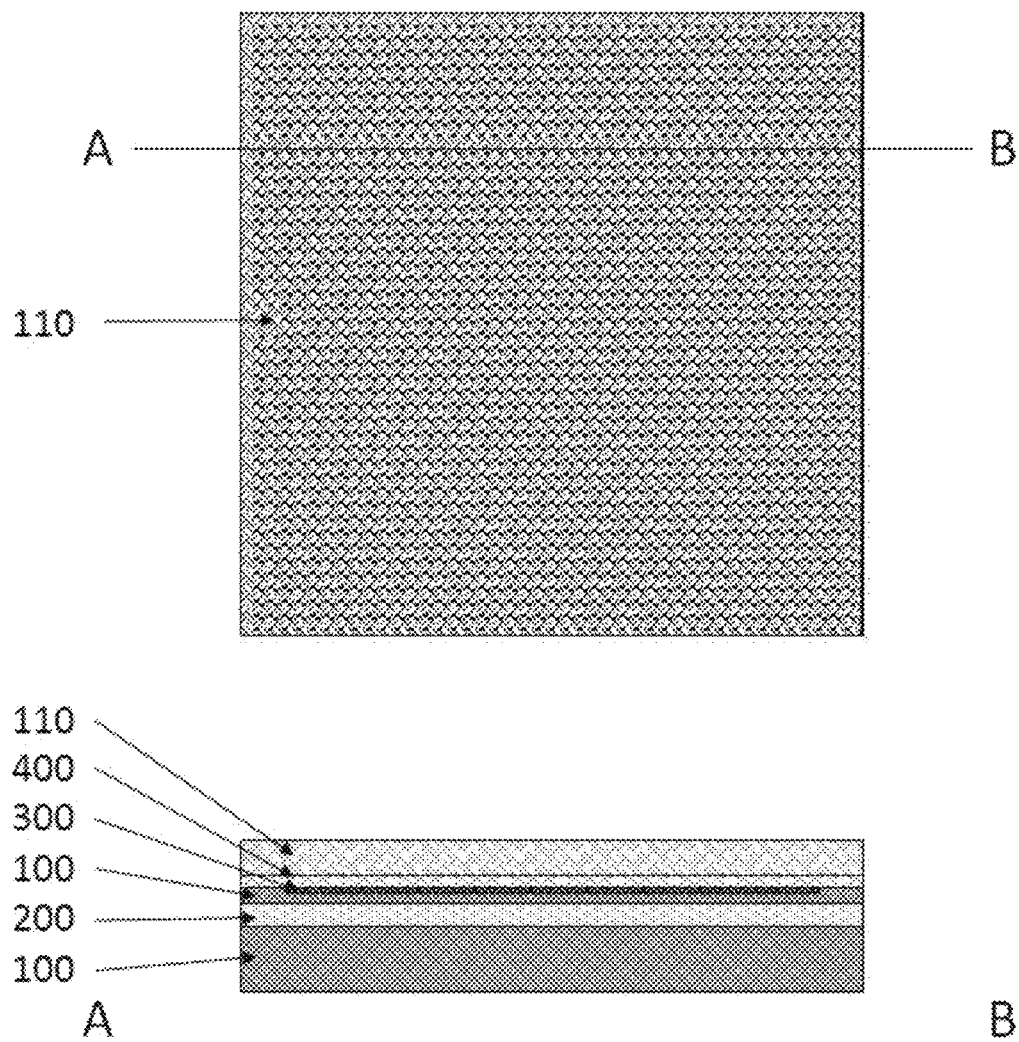

Referring to FIG. 11, a first support substrate 110 is adhered to the first adhesive resin 400, and in an embodiment of the present disclosure, the first support substrate 110 is a silicon substrate, but the present disclosure is not limited thereto.

Figure 12:
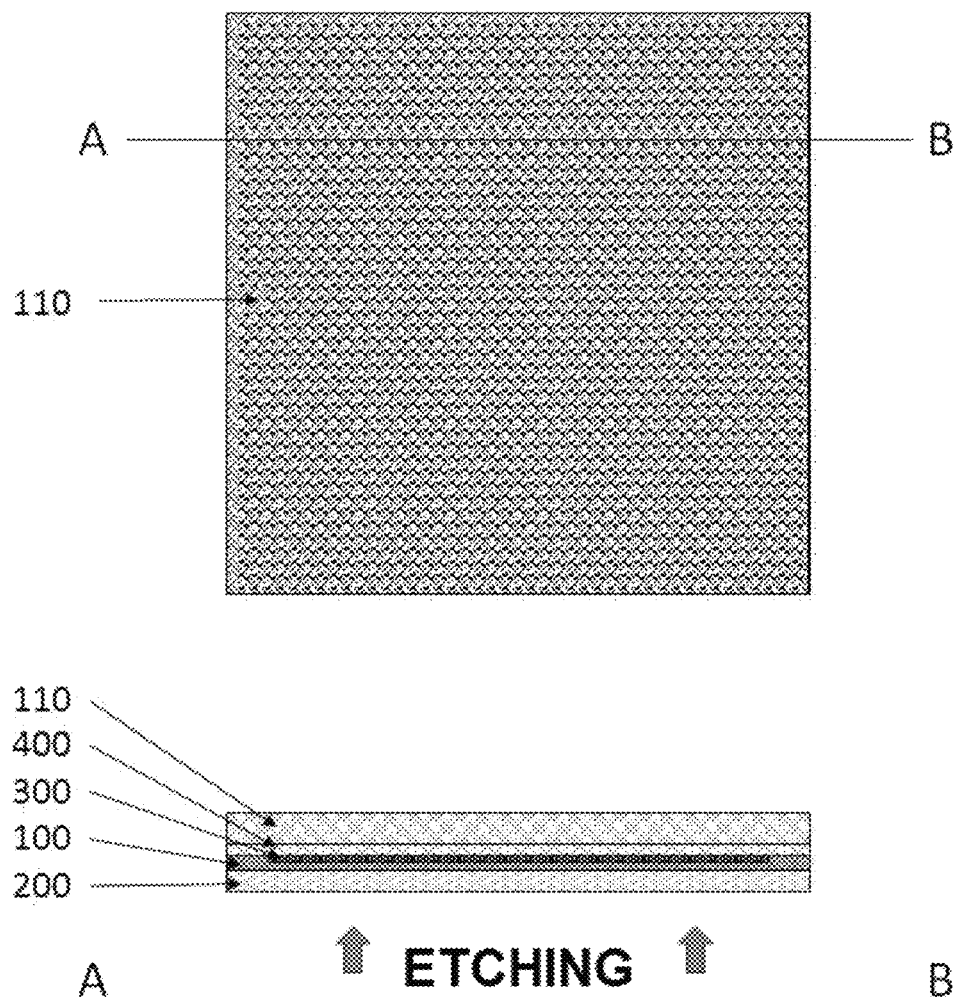

Referring to FIG. 12, a thickness of the circuit board is adjusted. In an embodiment of the present disclosure, the lower silicon layer 100 is removed by means of an etching process or the like due to a structural characteristic of the SOI substrate. In an embodiment of the present disclosure, the thickness of the SOI substrate is adjusted after an upper fixed substrate is adhered. If there is no upper fixed substrate, the substrate may be deformed due to an excessively reduced thickness of the substrate.

Figure 13:
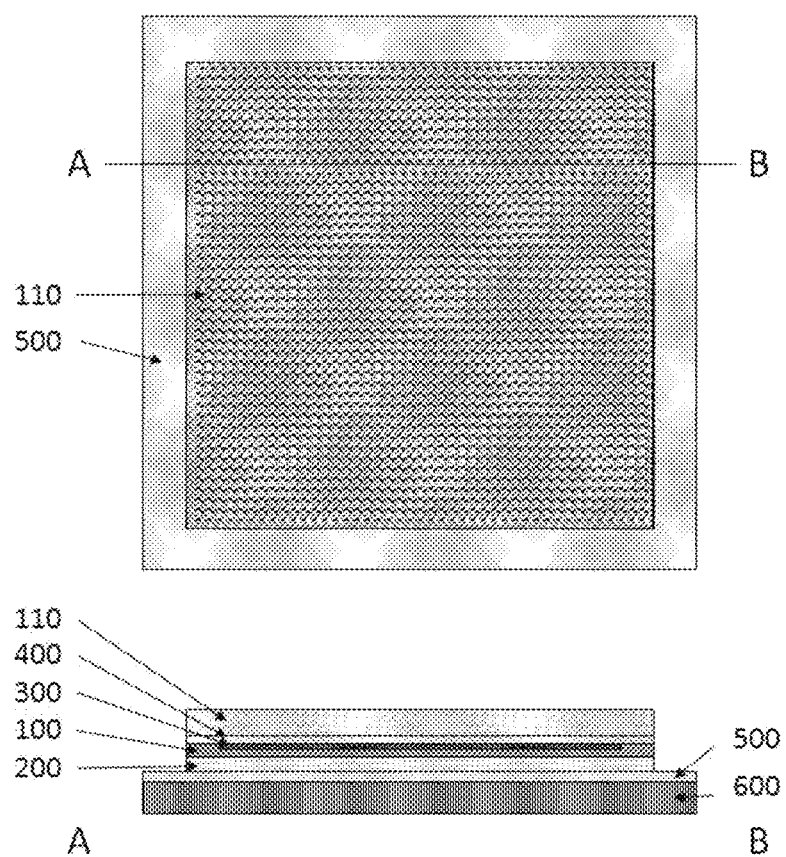

Referring to FIG. 13, the device and the substrate attached below the first support substrate 110 are transferred and adhered to a flexible substrate 600 coated with a second adhesive resin 500.

Figure 14:
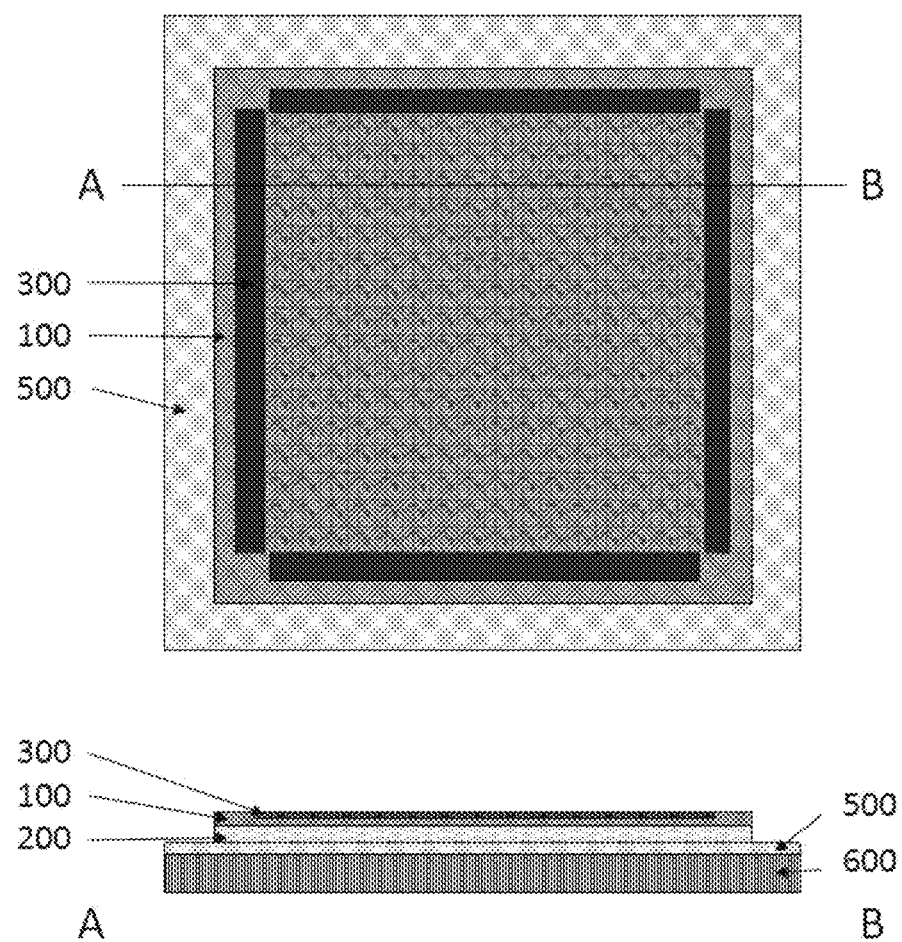

Referring to FIG. 14, the first support substrate 110 is separated from the electronic device 300 and is removed.

Figure 15:
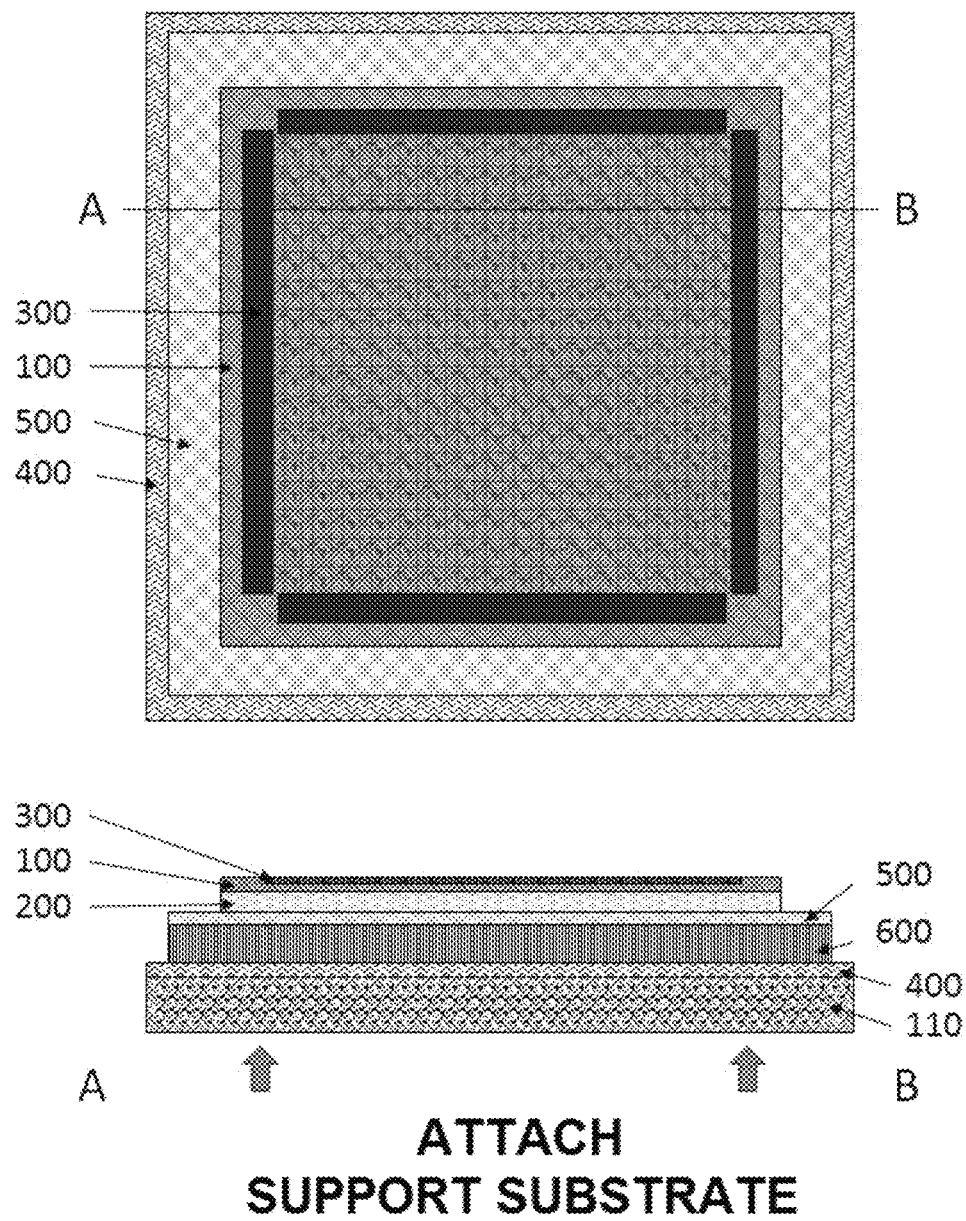

Referring to FIG. 15, the second support substrate 110 is adhered to the flexible substrate 600 by means of a third adhesive resin 400.

Figure 16:
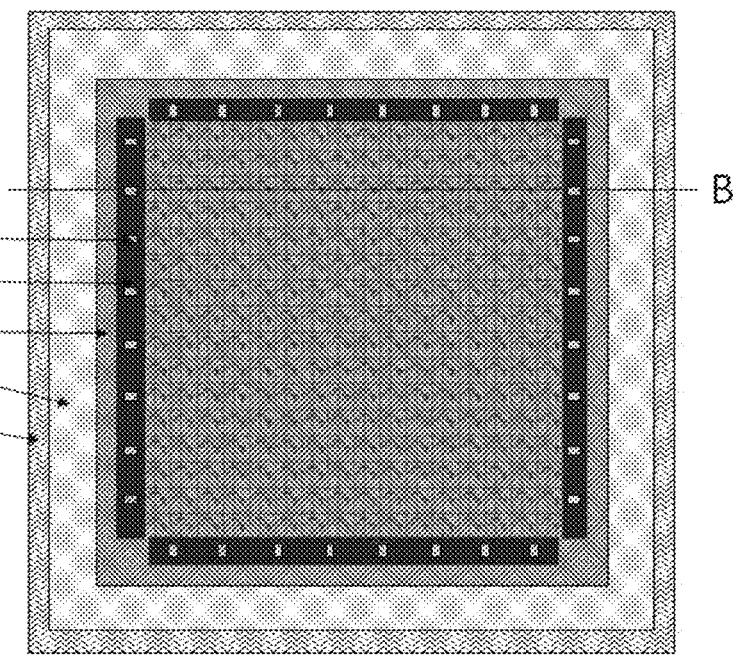
Figure 16:
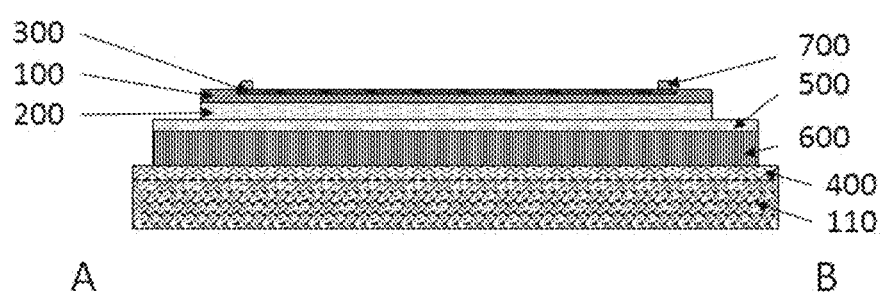

Referring to FIG. 16, a conductive material, for example a bump 700 serving as a protruded member made of metal material such as gold, is laminated on the electronic device 300. The bump 700 is electrically connected to the electronic device 300 and discharges an electric signal generated from the electronic device 30 to the outside, and further, the bump 700 serves as a member for accommodating a conductive substrate which is brought into contact thereto later.

Figure 17:
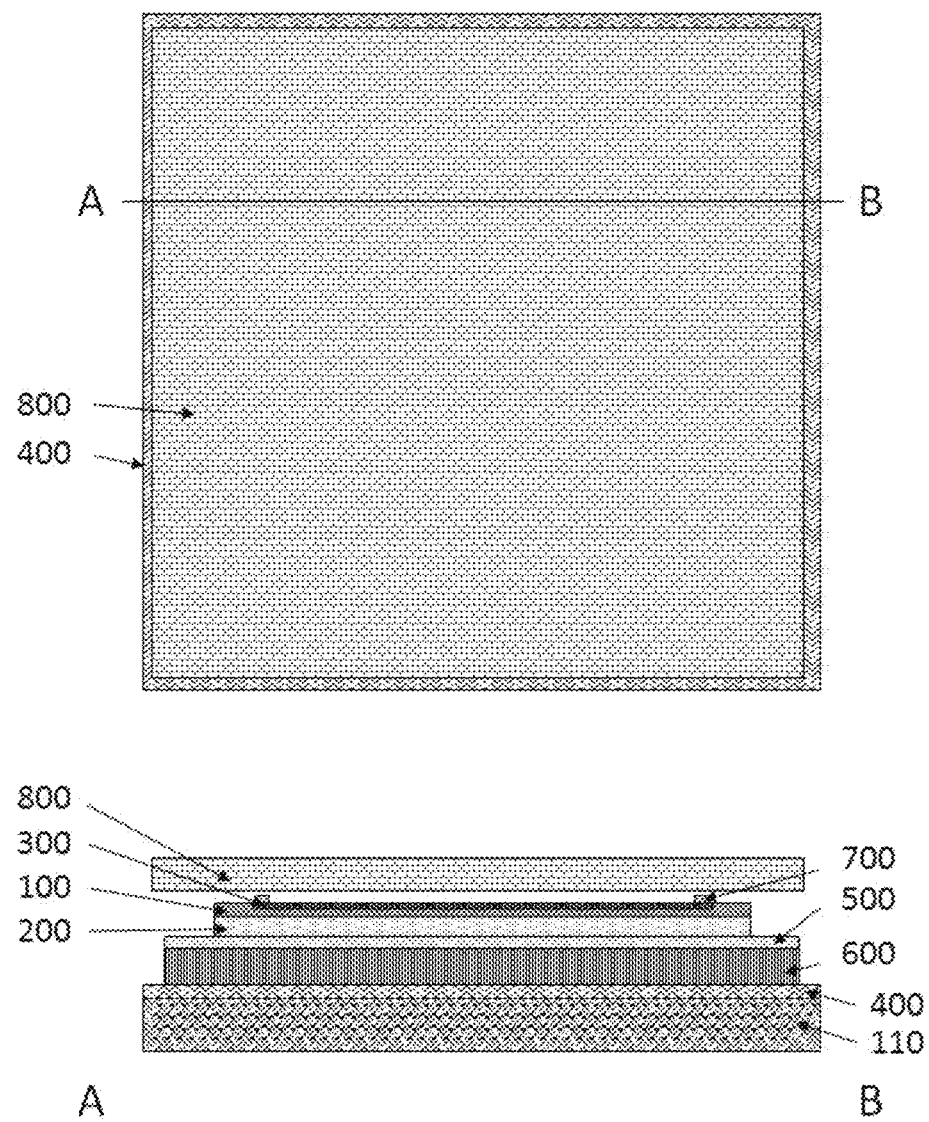

Referring to FIG. 17, an anisotropic conductive film 800 comes into contact with the bump 700 to face the bump 700.

Figure 18:
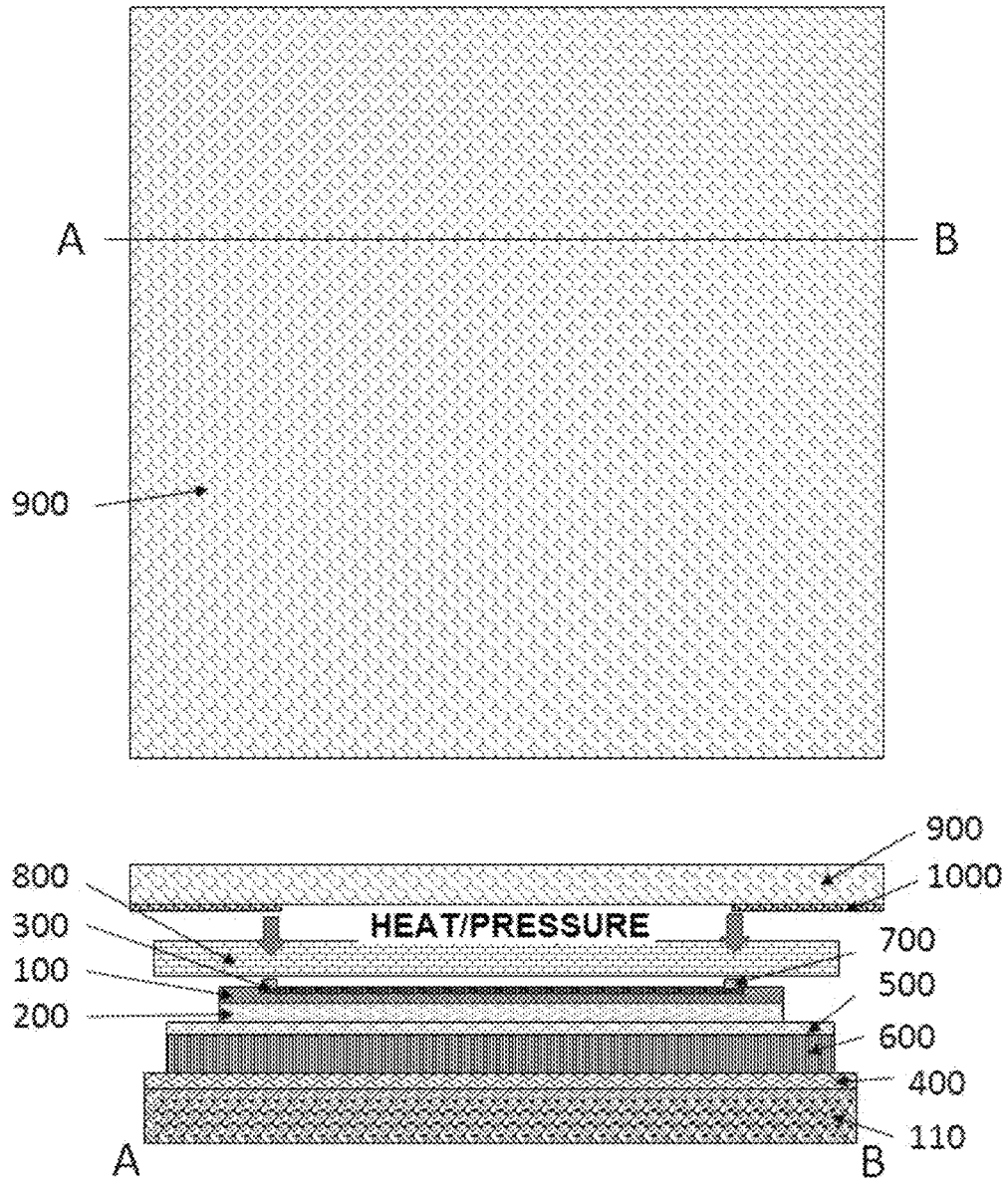
Figure 19:
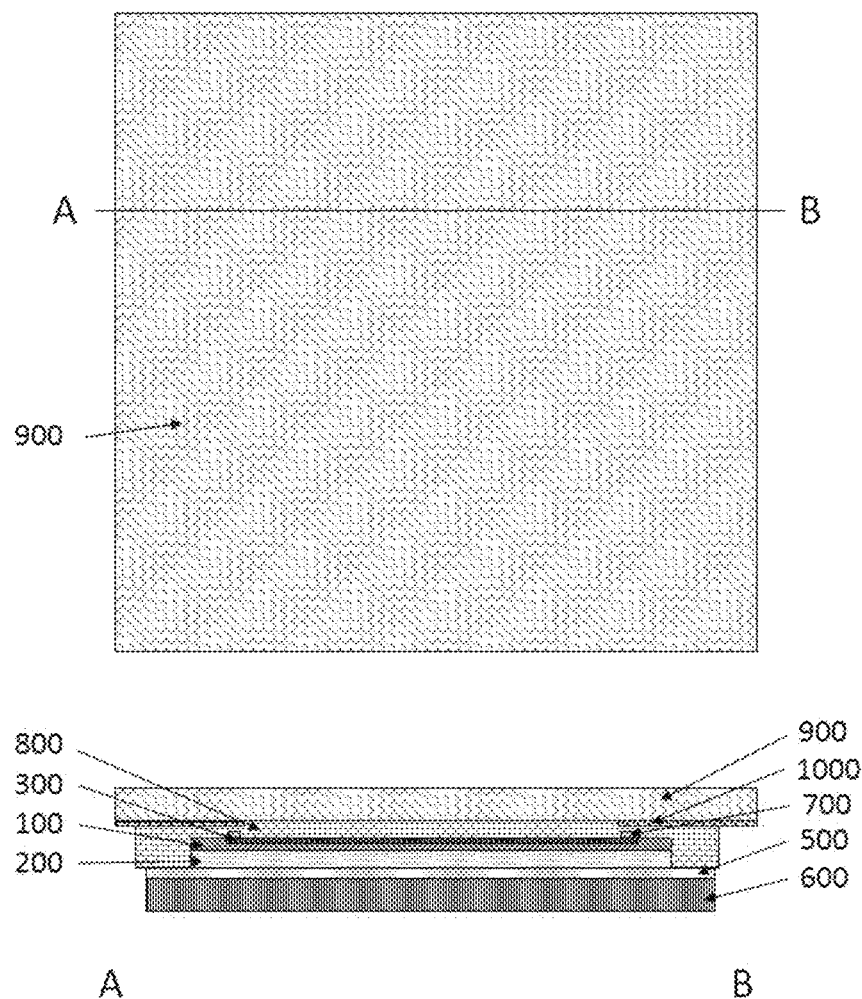

Referring to FIGS. 18 and 19, a second flexible substrate 900 is laminated on the anisotropic conductive film 800 and then heated and pressed. Accordingly, the anisotropic conductive film has conductivity and adhesion in a vertical direction and is isolated in a horizontal direction. At this time, in order to solve a problem that an electric signal from the electronic device is intercepted by the flexible substrate 900 basically having an isolation property, the inventor of the present disclosure provides an electrode line 1000 at the second flexible substrate 900 in advance to contact the anisotropic conductive film 800. By doing so, by means of the anisotropic conductive film 800 having conductivity in a vertical direction through the heating and pressing process, an electric signal generated from the device is electrically connected to the electrode line 1000 of the flexible substrate. In an embodiment of the present disclosure, the second flexible substrate 900 has a greater area than the circuit board, and the electrode line 1000 contacts the anisotropic conductive film 800 and then extends to a side of the flexible substrate 900 which is exposed to the outside. By doing so, the device may be electrically connected more easily after the device packaging process.

Figure 20:
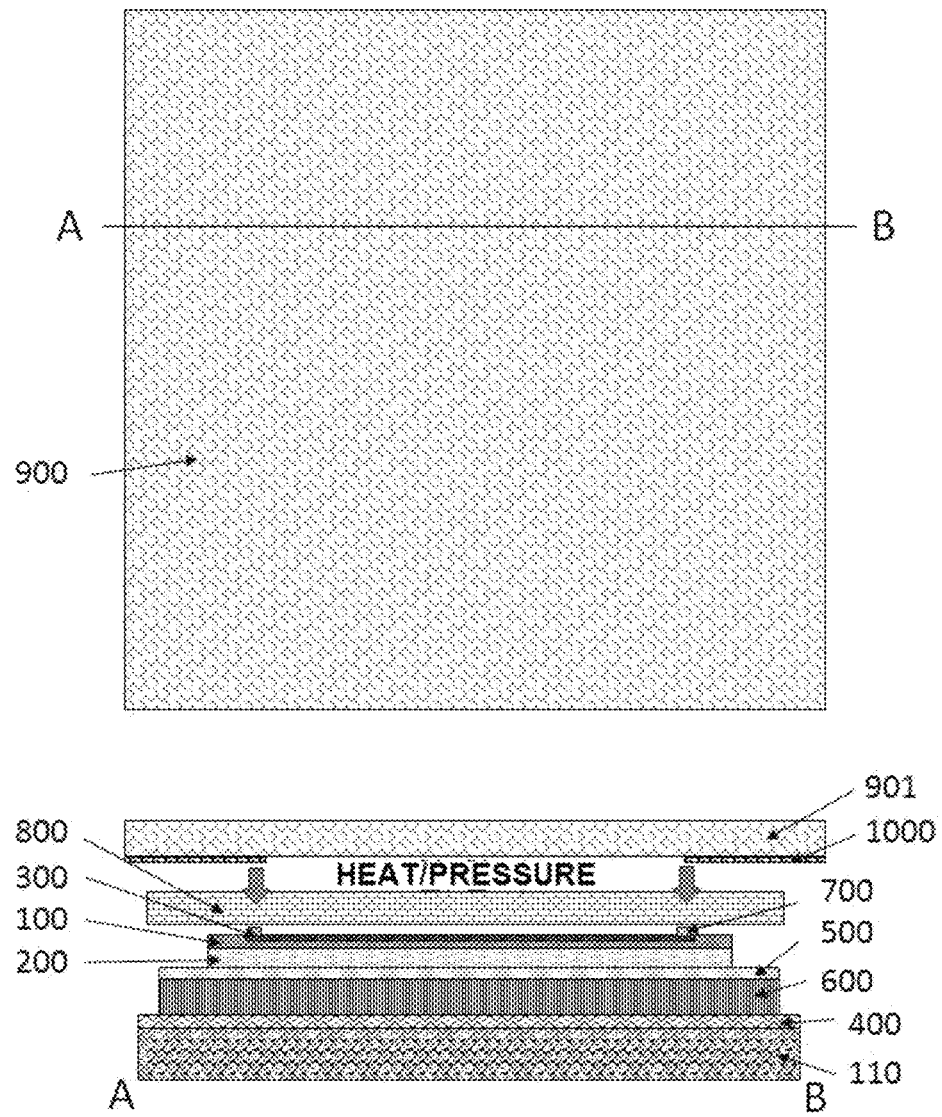
Figure 21:
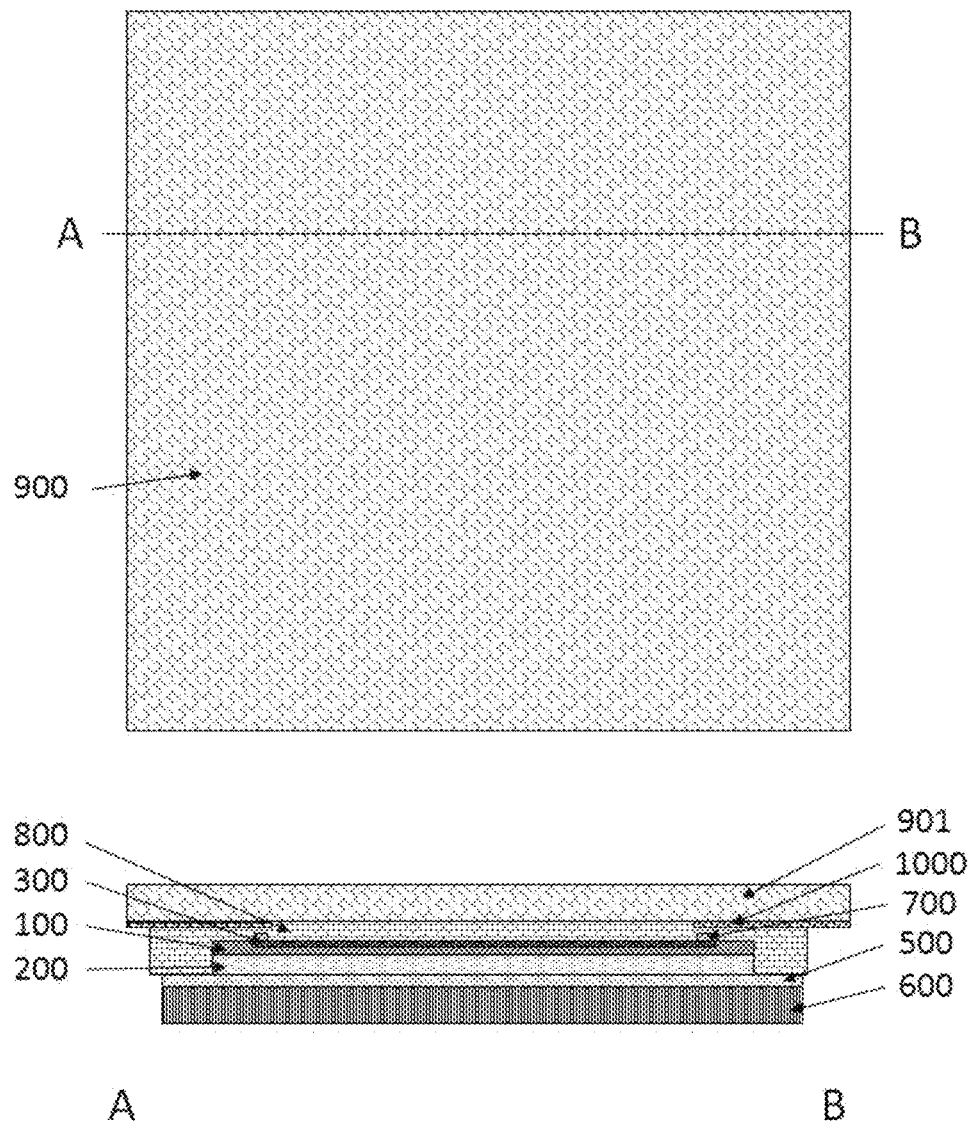

However, another flexible device 901 may also be used instead of the second flexible substrate 900, as depicted in FIGS. 20 and 21.

Figure 22:
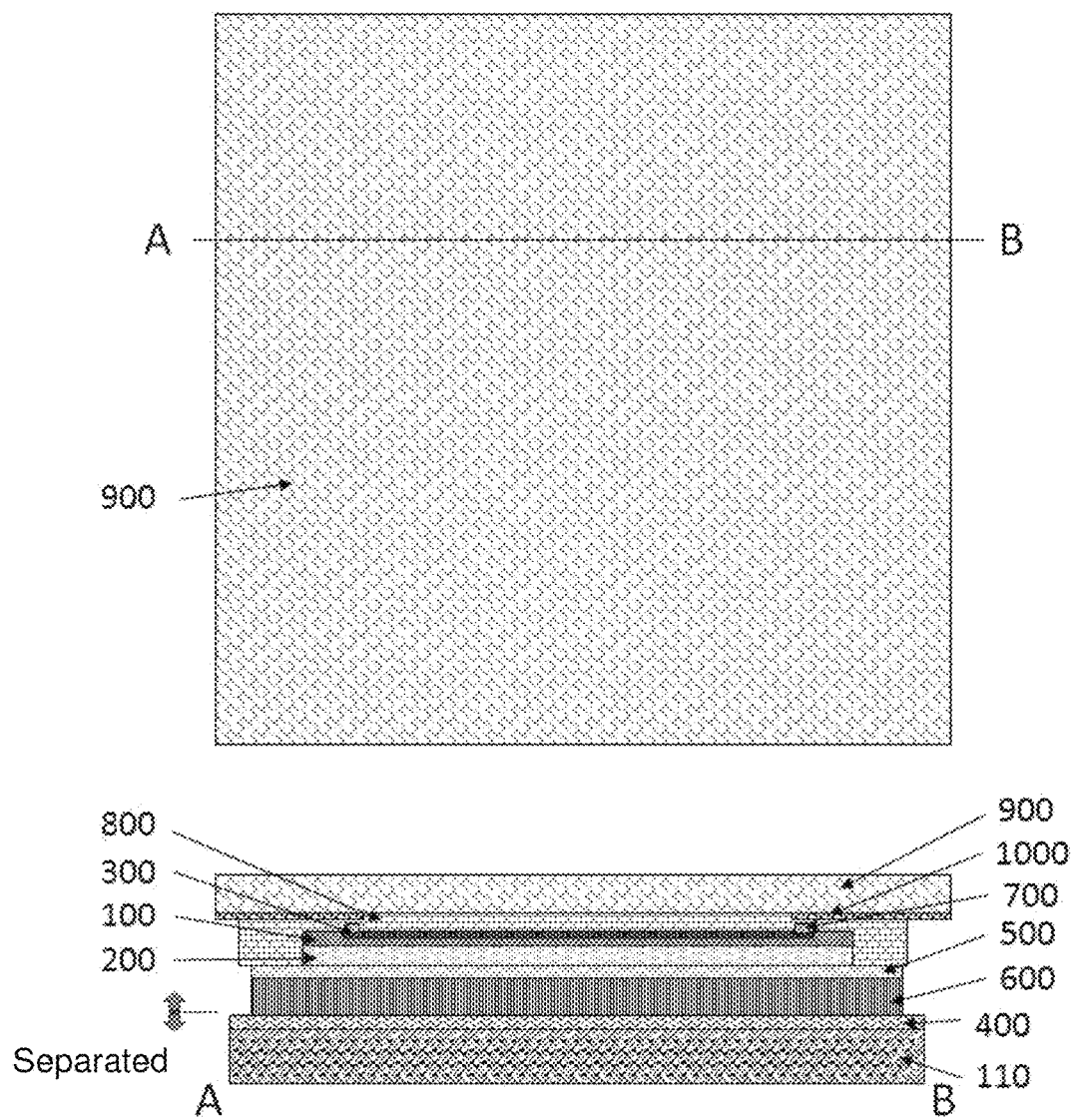
Figure 23:
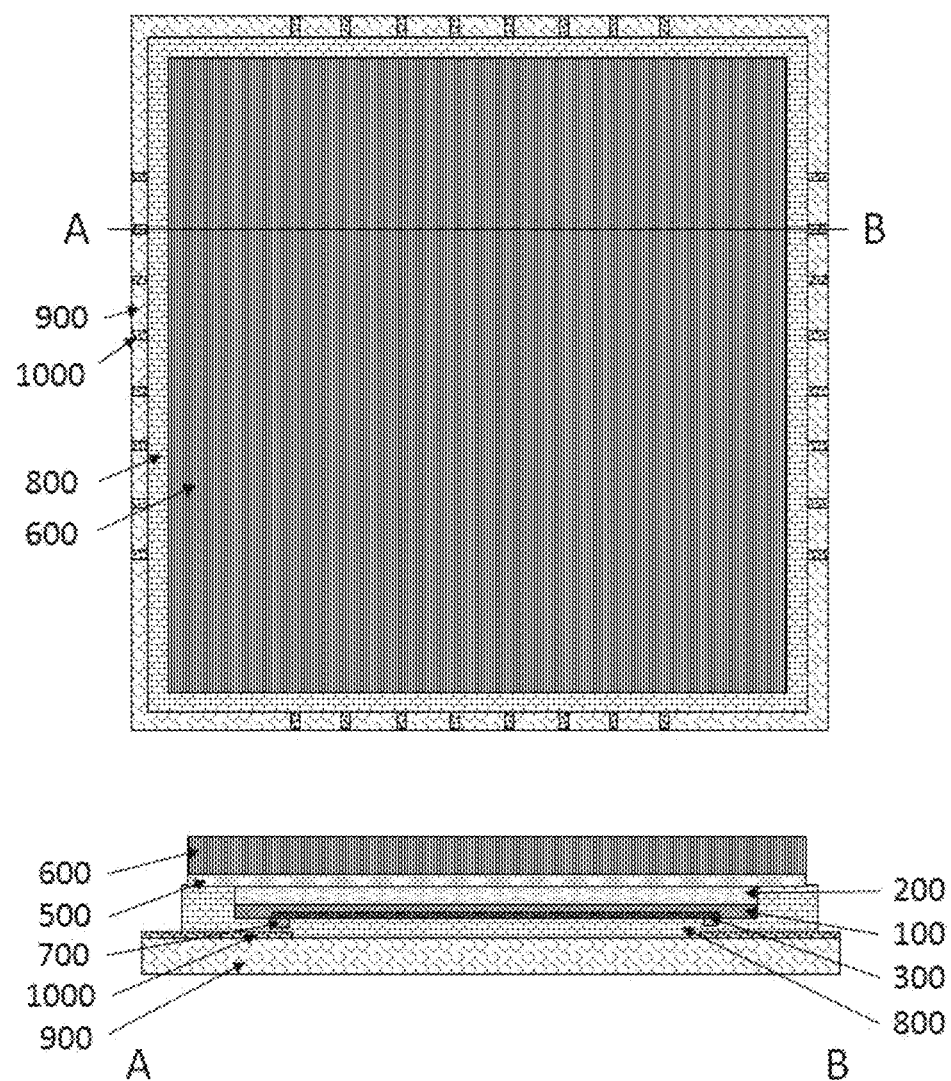

Referring to FIGS. 22 and 23, the second support substrate 110 is separated from the first flexible substrate 600. Accordingly, an electronic device manufactured from a silicon substrate provided between the first flexible substrate 600 and the second flexible substrate 900 and having a thickness which ensures flexibility is completed. An electric signal generated at the electronic device flows outwards through the bump 700 laminated on the electronic device, the anisotropic conductive film 800 contacting the bump 700, and the electrode line 1000 contacting the anisotropic conductive film. In a packaged device according to an embodiment of the present disclosure, a plurality of electrode lines 1000 spaced apart from each other is provided at a side extending from the circuit board due to a larger area, and the electrode lines 1000 are provided at all of four sides of the packaged device. In addition, the packaged device includes a first flexible substrate 600 at which the device is provided, an anisotropic conductive film 800 having a greater area than the first flexible substrate 600, and a second flexible substrate 900 having a greater area than the anisotropic conductive film 800. In addition, a plurality of electrode lines is provided at sides of the second flexible substrate 900, and the plurality of electrode lines extends to expose on the second flexible substrate for the connection to the outside.

Figure 24:
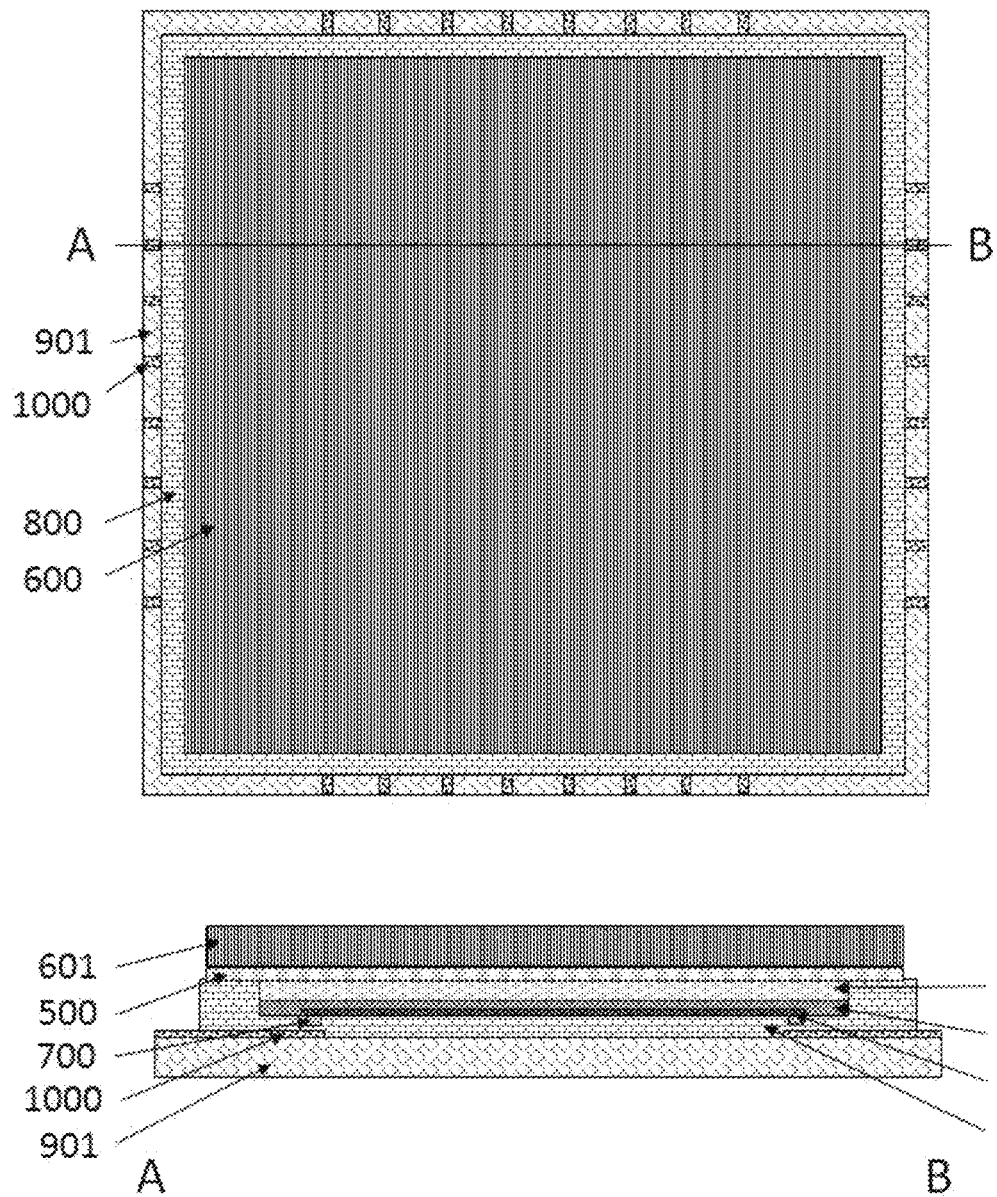

FIG. 24 shows that a flexible device 901 is used instead of the flexible substrate according to another embodiment of the present disclosure. In FIG. 24, a circuit board provided between the flexible substrate 600 and the second flexible device 901 is depicted, and the device 300 on the circuit board is connected to the outside through the electrode line 1000 extending to the side of the second flexible device 901.

FIGS. 25 to 33 are diagrams for illustrating a method for manufacturing a flexible device by using an anisotropic conductive film (ACF) according to another embodiment of the present disclosure.

Figure 25:
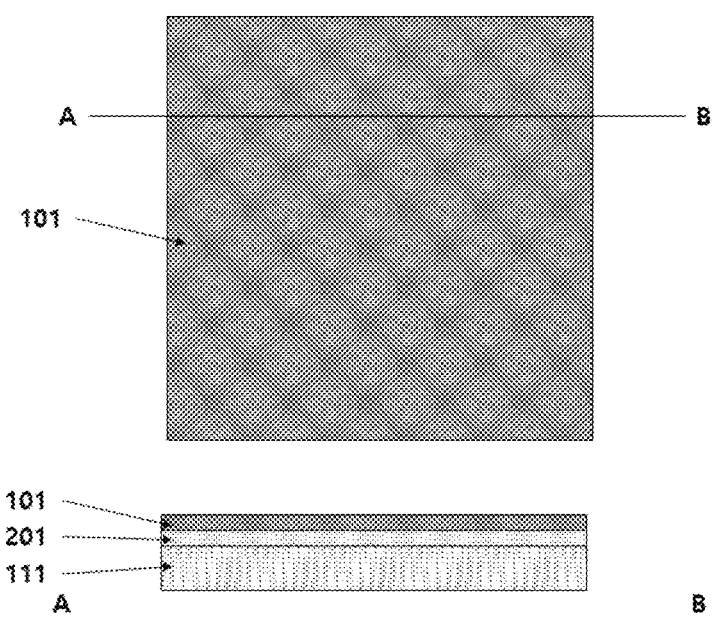
FIGS. 25 to 33 are diagrams for illustrating a method for manufacturing a flexible device by using an anisotropic conductive film (ACF) according to another embodiment of the present disclosure.

Referring to FIG. 25, a circuit board such as a SOI substrate is depicted, similar to FIG. 1. In an embodiment of the present disclosure, the SOI substrate is composed of a lower silicon layer 111, a silicon oxide layer 201 and an upper silicon layer 101, but the present disclosure is not limited thereto. In this specification, the circuit board means a substrate which is to be made into an electronic device such an integrated circuit.

Figure 26:
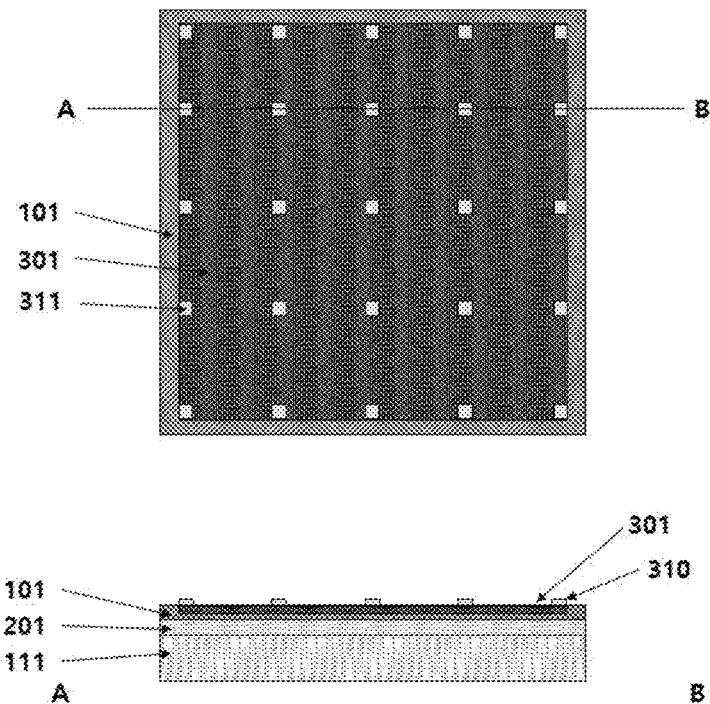

Referring to FIG. 26, the electronic device 301 is manufactured on the SOI substrate, and a bump 310 for emitting an electric signal generated at the electronic device 301 to the outside is provided on the electronic device 301.

Figure 27:
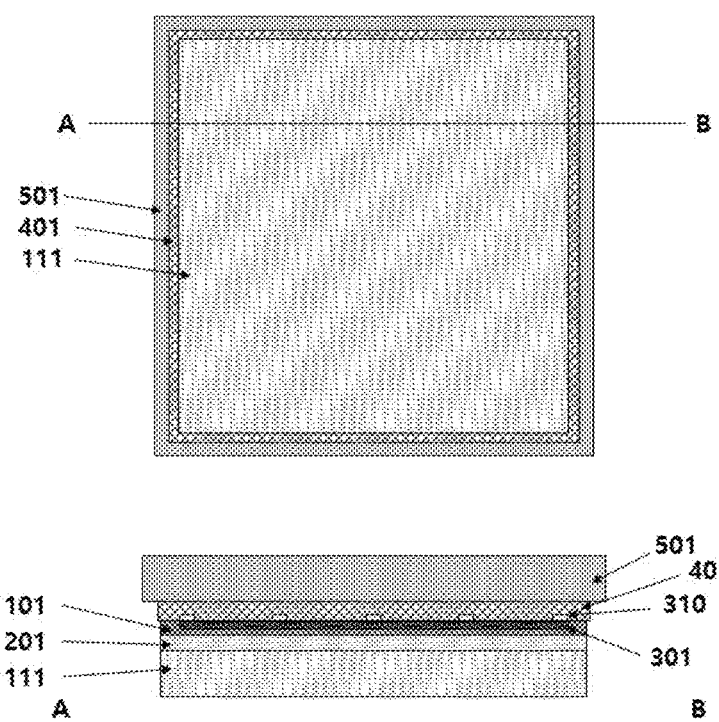

Referring to FIG. 27, a fixed substrate 501 is fixed in contact with the bump 310 and the electronic device 301, and in an embodiment of the present disclosure, the fixed substrate and the electronic device are adhered to each other. For this, the fixed substrate 501 may be coated with a separate adhesive layer 401.

Figure 28:
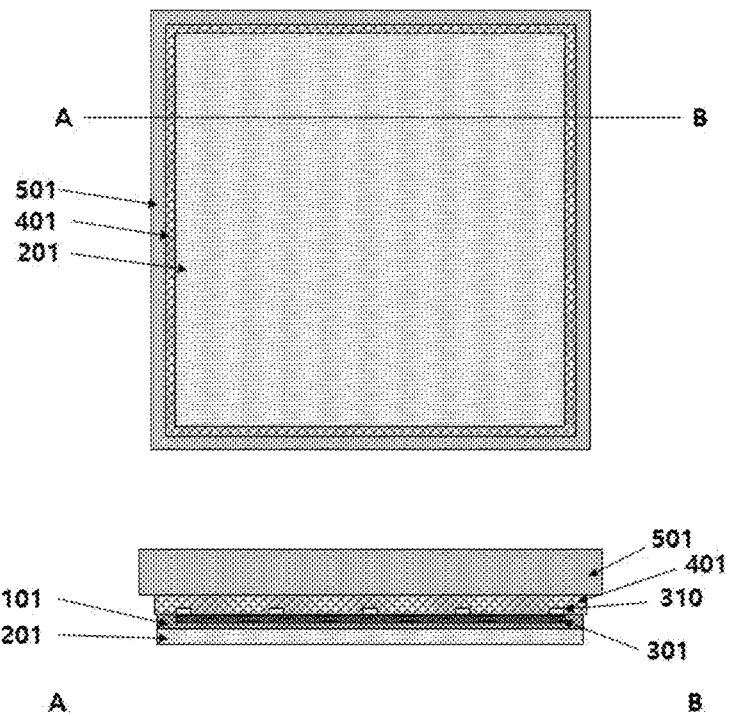

Referring to FIG. 28, the lower substrate 111 is removed by an etching process or the like, and thus the electronic device 301 manufactured on the thin film substrate is fixed by the fixed substrate 501. In an embodiment of the present disclosure, the fixed substrate 501 is made of polymer material such as PDMS or PR which has good adhesion to a silicon oxide layer and good bending and easily endures high temperature, but the present disclosure is not limited thereto.

Figure 29:
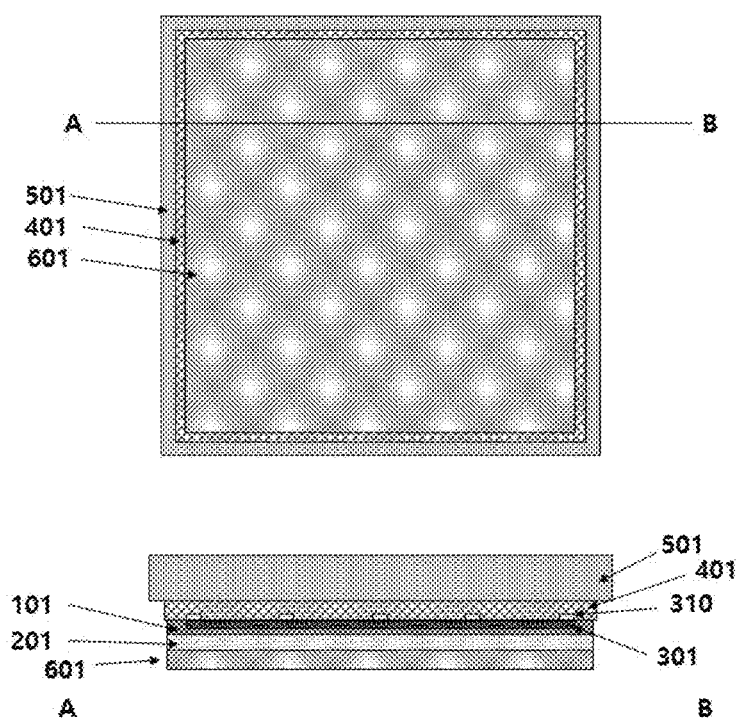

Referring to FIG. 29, another support substrate 601 such as silicon or glass is adhered to a lower portion of the circuit board (a silicon oxide layer 201 in an embodiment of the present disclosure) fixed by the fixed substrate 501.

Figure 30:
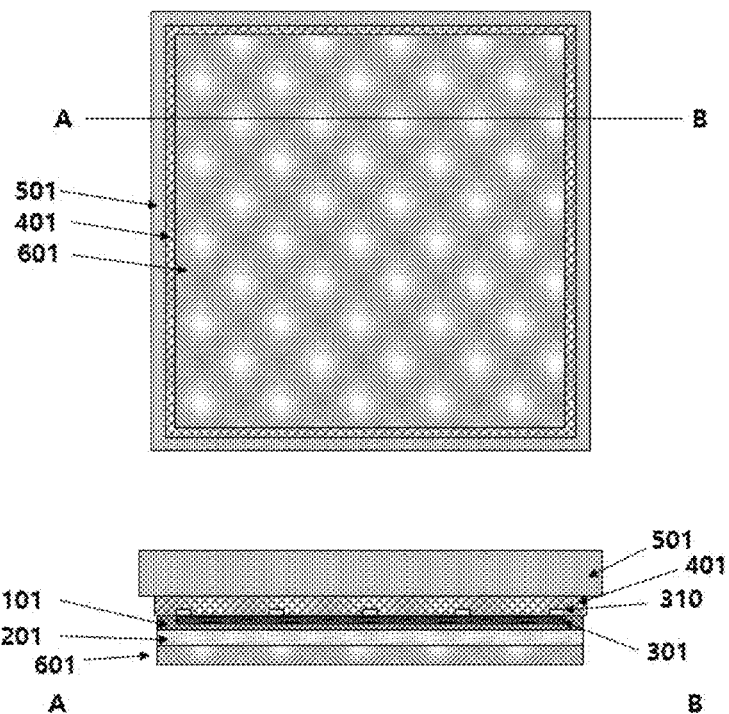

Referring to FIG. 30, after the support substrate 601 is adhered to the circuit board with a reduced thickness, the fixed substrate 501 adhered to the upper portion of the electronic device is removed by means of etching or physical manner.

Figure 31:
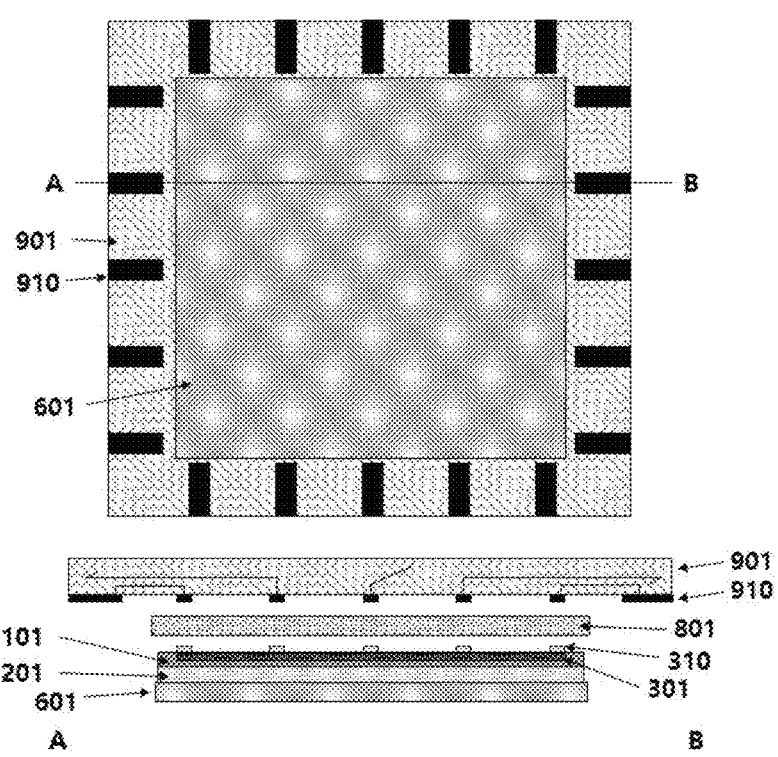
Figure 32:
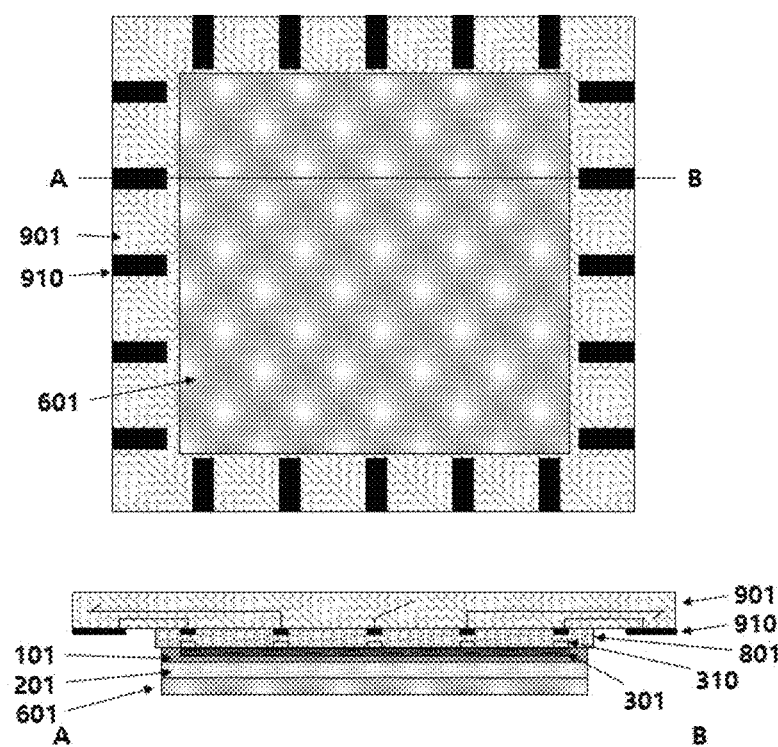
Figure 33:
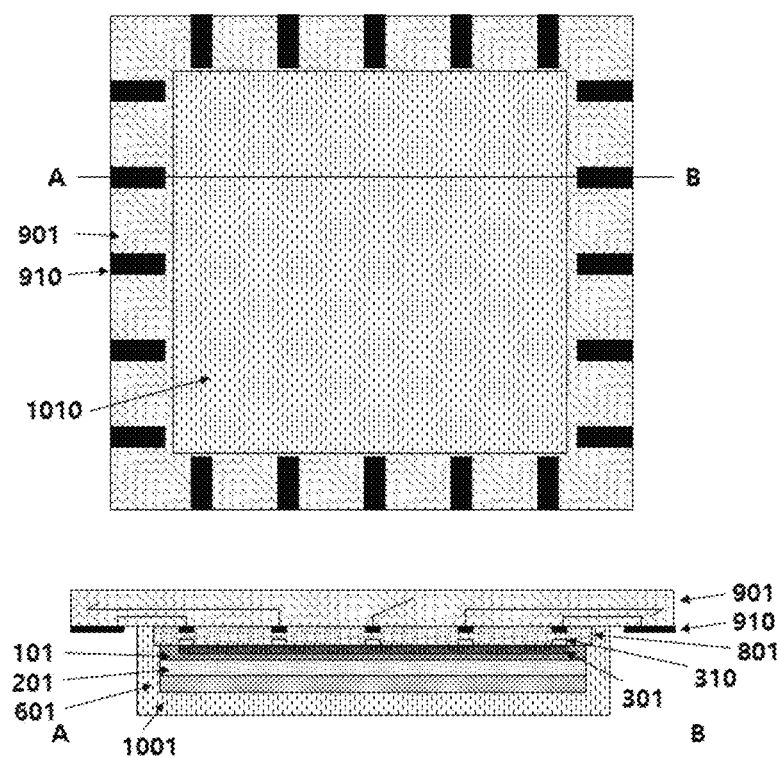

Referring to FIGS. 31 to 33, the flexible substrate 901 having the electrode line 910 is pressed toward the electronic device 201 between the anisotropic conductive films 801. At this time, heat is applied to a level in which the anisotropic conductive film 801 may melt, and by doing so, the electronic device 301 is electrically connected to the electrode line 910 of the flexible device through the anisotropic conductive film 801. After that, a passivation layer 1001 for protecting the electronic device 301 is coated thereto.

FIGS. 34 to 37 show photographs of flash memories, produced by etching a circuit board according to an embodiment of the present disclosure, and their analyzed characteristics.

Figure 34:
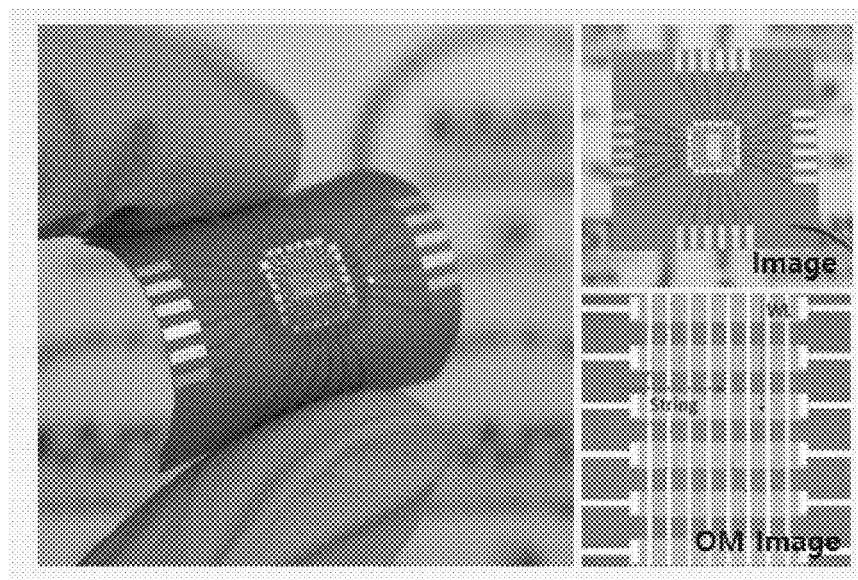
FIGS. 34 to 37 show photographs of flash memories, produced by etching a circuit board according to an embodiment of the present disclosure, and their analyzed characteristics.

Referring to FIG. 34, it can be understood that a flash memory device manufactured according to the present disclosure may be bent to a great extent.

Figure 35:
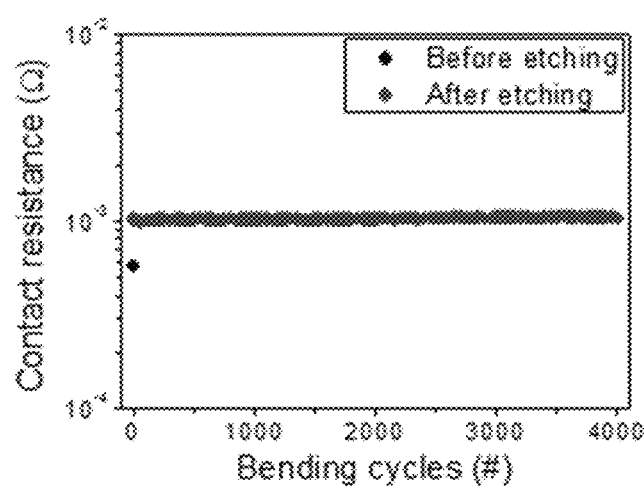

Referring to FIG. 35, in a bent state, it can be understood that the flash memory of FIG. 34 has a consistent contact resistance.

Figure 36:
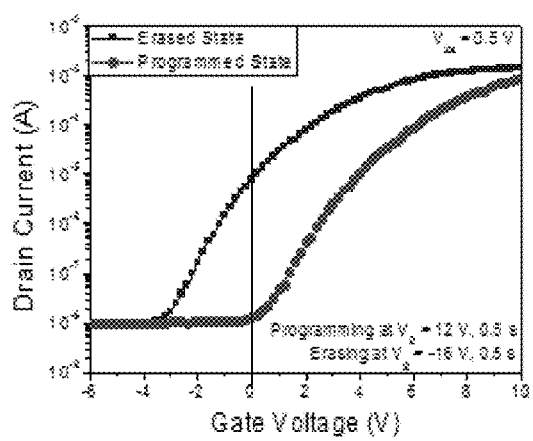
Figure 36:
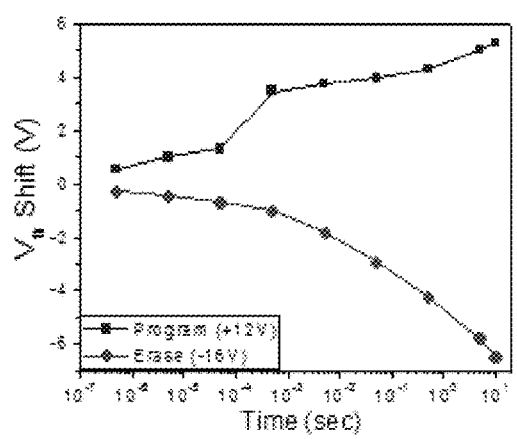
Figure 36:
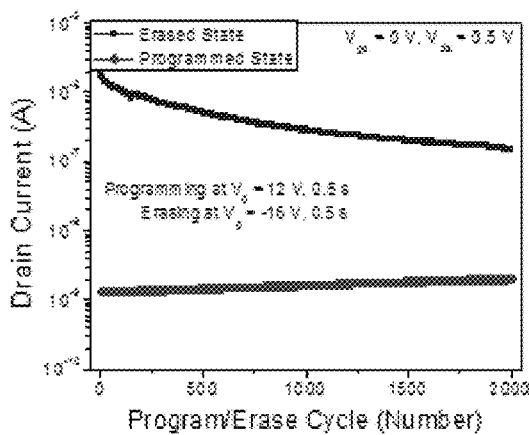
Figure 36:
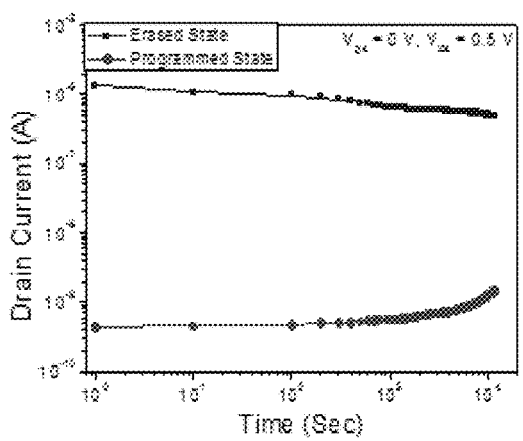

Referring to FIG. 36, it can be understood that the flash memory device manufactured according to the present disclosure may give memory operations even in a bent state.

Figure 37:
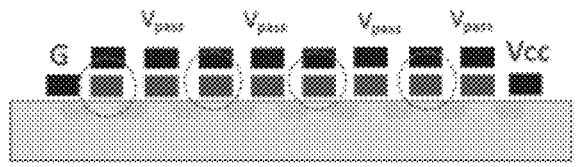
Figure 37:
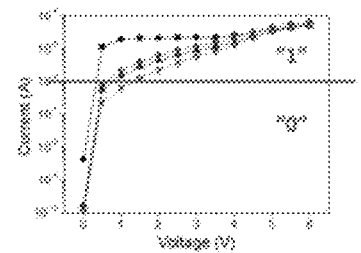
Figure 37:
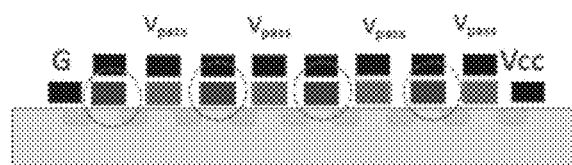
Figure 37:
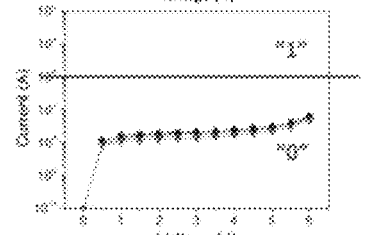
Figure 37:
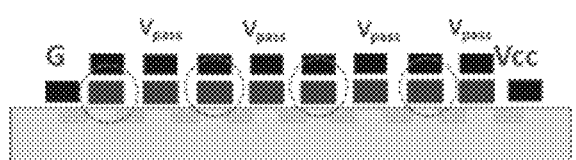
Figure 37:
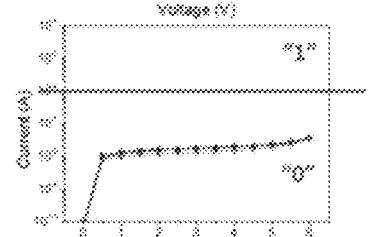
Figure 37:
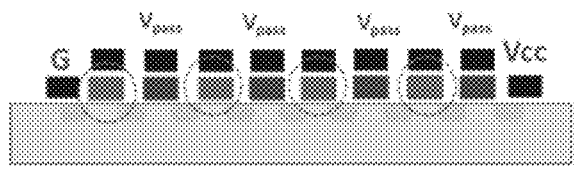
Figure 37:
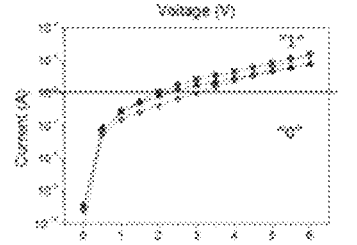
Figure 37:
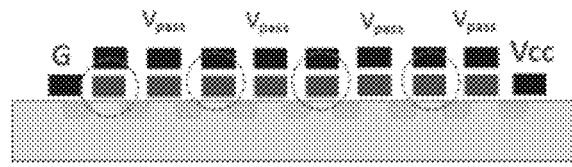
Figure 37:
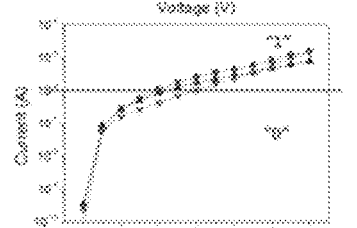

Referring to FIG. 37 showing operation data of a NAND-type flash memory, it can be understood that memory operations may be provided even in a bent state.

As described above, in the present disclosure, after an electronic device is manufactured into a circuit board, an etching process is performed to give flexibility to the circuit board. After that, the flexible substrate and the electronic device are electrically connected by means of the anisotropic conductive film. In particular, in the present disclosure, a plurality of devices is manufactured at the circuit board, and flexibility may be given to the circuit board just with a single etching process, which is very advantageous in its process.

While the present disclosure has been described with respect to the specific embodiments, it will be apparent to those skilled in the art that various changes and modifications may be made without departing from the spirit and scope of the invention as defined in the following claims.

What is claimed is:

1. A method for manufacturing a flexible device, comprising:
    preparing an electronic device on an upper portion of a circuit board;
    forming a bump on the electronic device such that the bump is attached to a top surface of the electronic device and protrudes upward from the electronic device;
    bringing a fixed substrate into contact with an upper portion of the electronic device to fix the circuit board; then
    reducing a thickness of the circuit board: then
    bringing a support substrate formed of silicon or glass into contact with a lower portion of the circuit board; then
    removing the fixed substrate; and then
    laminating an anisotropic conductive film toward an upper portion of the electronic device and heating and pressing a flexible substrate having an electrode line thereto, such that the anisotropic conductive film covers and comes in direct contact with the top surface of the electronic device, a side surface of the bump and an entire top surface of the bump, and then
    forming a passivation layer which comes in contact with the flexible substrate and coats a side surface of the anisotropic conductive film, a side surface of the circuit board and both of a side surface and a bottom surface of the support substrate formed of silicon or glass,
    wherein the flexible substrate is disposed on the upper portion of the circuit board, while the support substrate formed of silicon or glass is maintained in contact with the lower portion of the circuit board,
    wherein the electrode line of the flexible substrate is configured to contact the anisotropic conductive film and then extend to an outer side of the anisotropic conductive film.

2. The method for manufacturing a flexible device according to claim 1,
    wherein the circuit board is a SOI substrate, and said reducing of a thickness of the circuit board is performed by etching a lower silicon layer of the SOI substrate.

3. The method for manufacturing a flexible device according to claim 1,
    wherein said fixing of the circuit board is performed by adhering the fixed substrate to the electronic device on the circuit board.

4. The method for manufacturing a flexible device according to claim 1,
    wherein said bringing of a support substrate into contact with a lower portion of the circuit board is performed by adhering the support substrate to the lower portion of the circuit board.

5. The method for manufacturing a flexible device according to claim 1, wherein the bump includes a plurality of bumps which are spaced apart from each other by a predetermined distance.

6. The method for manufacturing a flexible device according to claim 1, wherein the anisotropic conductive film is laminated to cover an entire upper surface of the electronic device.

7. The method for manufacturing a flexible device according to claim 1, wherein:
    the anisotropic conductive film has electrical conductivity in a vertical direction with electrical isolation property in a horizontal direction;
    the flexible substrate, other than the electrode line, has electrical isolation property; and
    the electronic device is electrically connected to the electrode line such that an electric signal generated from the electronic device is connected to the electrode line via the anisotropic conductive film having electrical conductivity in a vertical direction.

* * * * *